United States Patent
Li et al.

(10) Patent No.: US 11,125,912 B2
(45) Date of Patent: Sep. 21, 2021

(54) GEOLOGIC FEATURE SPLITTING

(71) Applicant: Schlumberger Technology Corporation, Sugar Land, TX (US)

(72) Inventors: Zhenhua Li, Guangdong (CN); Qingrui Li, Beijing (CN); Ping Xu, Beijing (CN); Guang Xiong, Houston, TX (US); Lina Xu, Beijing (CN); Paolo Saverio Damiani, Bari (IT)

(73) Assignee: Schlumberger Technology Corporation, Sugar Land, TX (US)

( * ) Notice: Subject to any disclaimer, the term of this patent is extended or adjusted under 35 U.S.C. 154(b) by 927 days.

(21) Appl. No.: 14/551,667

(22) Filed: Nov. 24, 2014

(65) Prior Publication Data
US 2015/0149142 A1    May 28, 2015

Related U.S. Application Data

(60) Provisional application No. 61/908,469, filed on Nov. 25, 2013, provisional application No. 61/908,480, filed on Nov. 25, 2013.

(51) Int. Cl.
*G01V 99/00*    (2009.01)
*G06F 30/23*    (2020.01)

(52) U.S. Cl.
CPC ............ *G01V 99/00* (2013.01); *G01V 99/005* (2013.01); *G06F 30/23* (2020.01); *E21B 2200/20* (2020.05); *G01V 2210/642* (2013.01); *G01V 2210/646* (2013.01); *G01V 2210/66* (2013.01); *G01V 2210/663* (2013.01); *G01V 2210/74* (2013.01)

(58) Field of Classification Search
CPC ............ G01V 99/00; G01V 2210/663; G01V 2210/64; G01V 99/005
See application file for complete search history.

(56) References Cited

U.S. PATENT DOCUMENTS

| | | | | |
|---|---|---|---|---|
| 5,930,730 A | * | 7/1999 | Marfurt | G01V 1/301 702/16 |
| 6,014,343 A | * | 1/2000 | Graf | G01V 11/00 367/38 |
| 6,023,656 A | * | 2/2000 | Cacas | E21B 49/00 702/12 |
| 8,103,493 B2 | * | 1/2012 | Sagert | G01V 99/00 703/10 |

(Continued)

FOREIGN PATENT DOCUMENTS

WO    2008086352 A1    7/2008
WO    WO2013169620    11/2013

OTHER PUBLICATIONS

Dershowitz, William S. et al; Fractured reservoir discrete feature network technologies. Final report, Mar. 7, 1996 to Sep. 30, 1998, report, Dec. 1998; United States. (https://digital.library.unt.edu/ark:/67531/metadc705669/), University of North Texas Libraries. pp. 341 (Year: 1996).*

(Continued)

*Primary Examiner* — Akash Saxena

(57) ABSTRACT

A method includes receiving information that defines a three-dimensional subterranean structure; splitting the three-dimensional subterranean structure into portions; generating convex hulls for the portions; and generating a discrete fracture network based at least in part on the convex hulls.

13 Claims, 20 Drawing Sheets

(56) References Cited

U.S. PATENT DOCUMENTS

| | | | | |
|---|---|---|---|---|
| 9,228,415 | B2* | 1/2016 | Ingham | E21B 41/00 |
| 9,377,546 | B2* | 6/2016 | Vallikkat Thachaparambil | G01V 1/282 |
| 9,665,537 | B2* | 5/2017 | Khvoenkova | G01V 99/005 |
| 2003/0112704 | A1* | 6/2003 | Goff | G01V 1/30 367/72 |
| 2007/0168169 | A1* | 7/2007 | Neave | G06K 9/469 703/10 |
| 2010/0191516 | A1* | 7/2010 | Benish | E21B 43/00 703/10 |
| 2010/0250216 | A1* | 9/2010 | Narr | G06F 17/5018 703/10 |
| 2010/0274543 | A1* | 10/2010 | Walker | G01V 99/00 703/6 |
| 2011/0106514 | A1* | 5/2011 | Omeragic | G01V 11/00 703/10 |
| 2011/0211761 | A1* | 9/2011 | Wang | G06T 17/05 382/203 |
| 2012/0185225 | A1* | 7/2012 | Onda | E21B 43/26 703/10 |
| 2013/0144532 | A1* | 6/2013 | Williams | G01V 1/50 702/11 |
| 2013/0294197 | A1* | 11/2013 | Vallikkat Thachaparambil | G01V 1/282 367/73 |
| 2013/0332125 | A1* | 12/2013 | Suter | G01V 99/00 703/6 |
| 2014/0058713 | A1* | 2/2014 | Thachaparambil | G01V 99/005 703/10 |
| 2014/0188392 | A1* | 7/2014 | Aarre | G01V 1/301 702/14 |
| 2014/0358510 | A1* | 12/2014 | Sarkar | G06F 17/5009 703/10 |
| 2015/0285950 | A1* | 10/2015 | Yarus | G01V 99/005 703/2 |
| 2016/0123119 | A1* | 5/2016 | Tueckmantel | E21B 49/00 703/10 |
| 2017/0343689 | A1* | 11/2017 | Dykstra | G01V 1/288 |
| 2019/0011600 | A1* | 1/2019 | Malvesin | G01V 99/005 |

OTHER PUBLICATIONS

La Pointe, et al., "Compartmentalization Analysis using Discrete Fracture Network Models", International reservoir characterization technical conference, Houston, TX; retrieved from the internet: http://www.osti.gov/scicech/biblio/570175-VnzseS/webviewable/, Mar. 2-4, 1997, pp. 7-8, 11.

Blocher, et al., "Three dimensional modelling of fractured and faulted reservoirs: Framework and implementation," Chemie der Erde-Geochemistry, Elsevier, Amsterdam, NL, vol. 70, Aug. 1, 2010, pp. 145-153.

Search Report for the equivalent European patent application 14863440.5 dated Nov. 10, 2016.

Communication pursuant to Article 94(3) for the equivalent European patent application 14863440.5 dated Mar. 20, 2017.

Garland, et al., "Hierarchical face clustering on polygonal surfaces," 13D '01 Proceedings of the 2001 symposium on Interactive 3D graphics, pp. 49-58, ACM New York, NY, USA 2001.

Cohen-Steiner, et al., "Variational Shape Approximation," Institute National de Recherche En Informatique Et En Automatique (INRIA), No. 5371, Nov. 2004.

Roncella, et al., "Extraction of Planar Patches from Point Clouds to Retrieve Dip and Dip Direction of Rock Discontinuities," ISPRS WG III/3 III/4, V/3 Workshop "Laser scanning 2005," Enschede, the Netherlands, Sep. 12-14, 2005, pp. 162-167.

Graham, "An Efficient Algorithm for Determining the Convex Hull of the Finite Planar Set," Information Processing Letters 1, 1972, pp. 132-133.

International Search Report and Written Opinion for the equivalent International patent application PCT/US2014/067391 dated Feb. 27, 2015.

LaPointe et al. "Reservoir Compartmentalization—Fractured Reservoir Discrete Feature Network Technologies," Compartmentalization Research Report, Feb. 14, 1997, retrieved at http://www.fracturedreservoirs.com/niper/database/REPORTS/RES_CHAR/0212PRL1.htm on Nov. 17, 2017.

Wang, "New Technology of Fracture Modeling for DFN Model," Fault-Block Oil & Gas Field, vol. No. 15, issue No. 6, Nov. 30, 2008.

Wang, et al. "Realization and Optimization of Random Discrete Fracture Network Model for Buried Hill Fractured Reservoir in Bohai C Oilfield," Lithologic Reservoirs, Feb. 29, 2012.

Xu, et al., Reservoir Fracture Modeling Based on Discrete Crack Network Model, Journal of Daqing Petroleum Institute, vol. No. 35, issue No. 3.

Office Action for the equivalent Chinese patent application 2014800740606 dated May 26, 2017.

Communication pursuant to Article 94(3) for the equivalent European patent application 14863440.5 dated Dec. 22, 2020, 6 pages.

Communication pursuant to Article 94(3) for the equivalent European patent application 14863440.5 dated Jan. 3, 2019, 6 pages.

* cited by examiner

Method 710

Method 910

Method 1010

Method 1410

Method 1510

$S = f(a,b,c)$

Method 1610

GEOLOGIC FEATURE SPLITTING

RELATED APPLICATIONS

This application claims the benefit of and priority to a U.S. Provisional Application Ser. No. 61/908,469, filed 25 Nov. 2013, which is incorporated by reference herein, and this application claims the benefit of and priority to a U.S. Provisional Application Ser. No. 61/908,480, filed 25 Nov. 2013, which is incorporated by reference herein.

BACKGROUND

Data may be processed and interpreted, for example, to understand better composition, fluid content, extent and geometry of subsurface rocks.

SUMMARY

In accordance with some embodiments, a method is performed that includes: receiving information that defines a three-dimensional subterranean structure; splitting the three-dimensional subterranean structure into portions; generating convex hulls for the portions; and generating a discrete fracture network based at least in part on the convex hulls.

In some embodiments, an aspect of a method includes simulating phenomena associated with a subterranean formation based at least in part on a model that include a discrete fracture network.

In some embodiments, an aspect of a method includes generating convex hulls by applying a Graham scan algorithm.

In some embodiments, an aspect of a method includes splitting by implementing an angular splitting parameter.

In some embodiments, an aspect of a method includes splitting that generates line segments where, for example, each of the line segments includes respective end points.

In some embodiments, an aspect of a method includes splitting a curve where the curve is determined by intersection of a subterranean structure with a plane and, for example, repeating the splitting for a plurality of positions of the plane along a coordinate direction.

In some embodiments, an aspect of a method includes splitting by intersecting a three-dimensional subterranean structure by a plane to generate intersection points that form a curve and then splitting the curve into portions where, for example, splitting can include representing each of the portions by a line segment and where, for example, each of the line segments is associated with a respective area.

In some embodiments, an aspect of a method includes generating at least one convex hull by determining a best fit plane.

In some embodiments, an aspect of a method includes outputting a discrete fracture network as a model represented at least in part by a set of convex hulls.

In some embodiments, an aspect of a method includes tessellating at least a portion of a subterranean structure into polygons; computing a normal for each of the polygons; and determining one or more dip values based on the normals of the polygons.

In accordance with some embodiments, a computing system is provided that includes at least one processor, at least one memory, and one or more programs stored in the at least one memory, where the one or more programs are configured to be executed by the one or more processors, the one or more programs including instructions to: receive information that defines a three-dimensional subterranean structure; split the three-dimensional subterranean structure into portions; generate convex hulls for the portions; and generate a discrete fracture network based at least in part on the convex hulls.

In some embodiments, an aspect of a computing system includes instructions to simulate phenomena associated with a subterranean formation based at least in part on a model that includes a discrete fracture network.

In some embodiments, an aspect of a computing system includes instructions to generate a convex hull for at least one of a portion of a subterranean structure by, at least in part, by application of a Graham scan algorithm.

In accordance with some embodiments, a computer readable storage medium is provided, the medium having a set of one or more programs including instructions that when executed by a computing system cause the computing system to receive information that defines a three-dimensional subterranean structure; split the three-dimensional subterranean structure into portions; generate convex hulls for the portions; and generate a discrete fracture network based at least in part on the convex hulls.

In some embodiments, an aspect of a computer readable storage medium includes instructions to simulate phenomena associated with a subterranean formation based at least in part on a model that includes a discrete fracture network.

In some embodiments, an aspect of a computer readable storage medium includes instructions to generate a convex hull for at least one portion of a subterranean structure via application of a Graham scan algorithm.

This summary is provided to introduce a selection of concepts that are further described below in the detailed description. This summary is not intended to identify key or essential features of the claimed subject matter, nor is it intended to be used as an aid in limiting the scope of the claimed subject matter.

BRIEF DESCRIPTION OF THE DRAWINGS

Features and advantages of the described implementations can be more readily understood by reference to the following description taken in conjunction with the accompanying drawings.

DETAILED DESCRIPTION

Figure 1:
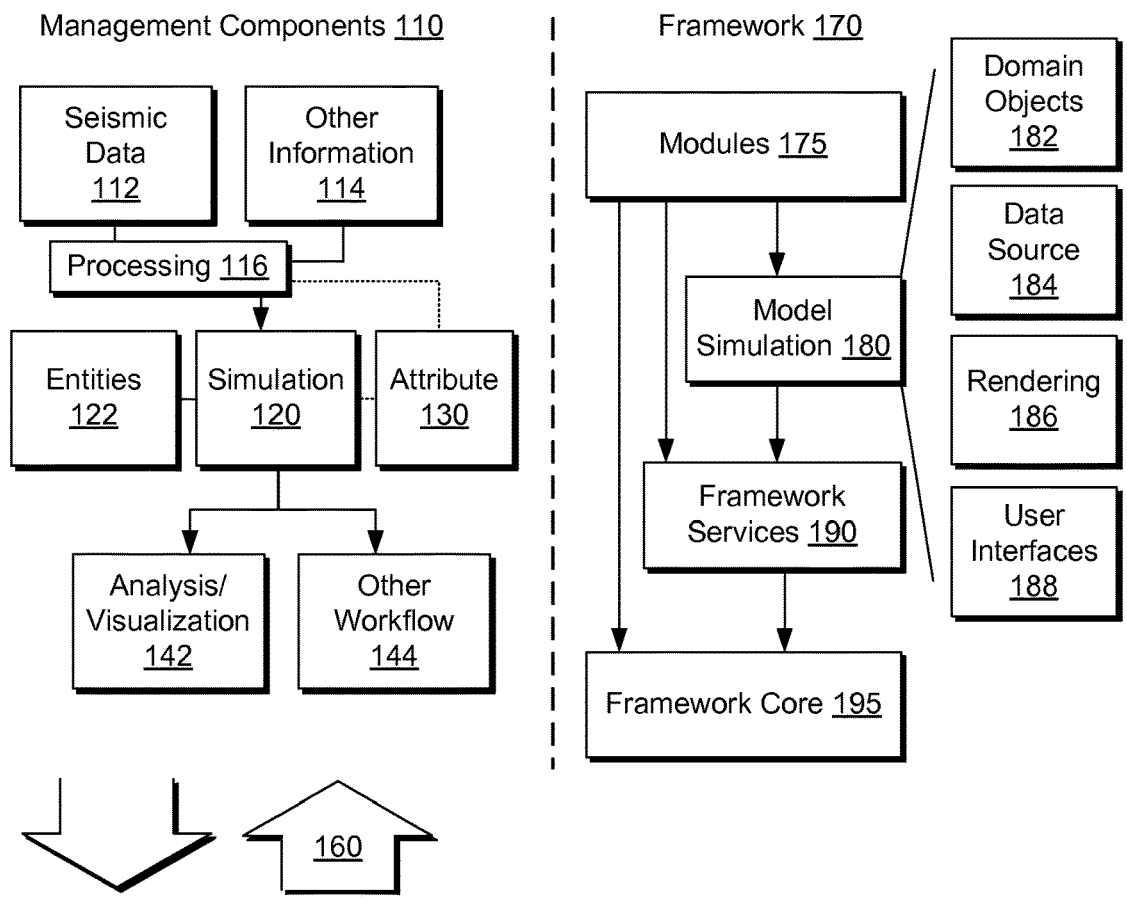
FIG. 1 illustrates an example system that includes various components for modeling a geologic environment.
Figure 1:
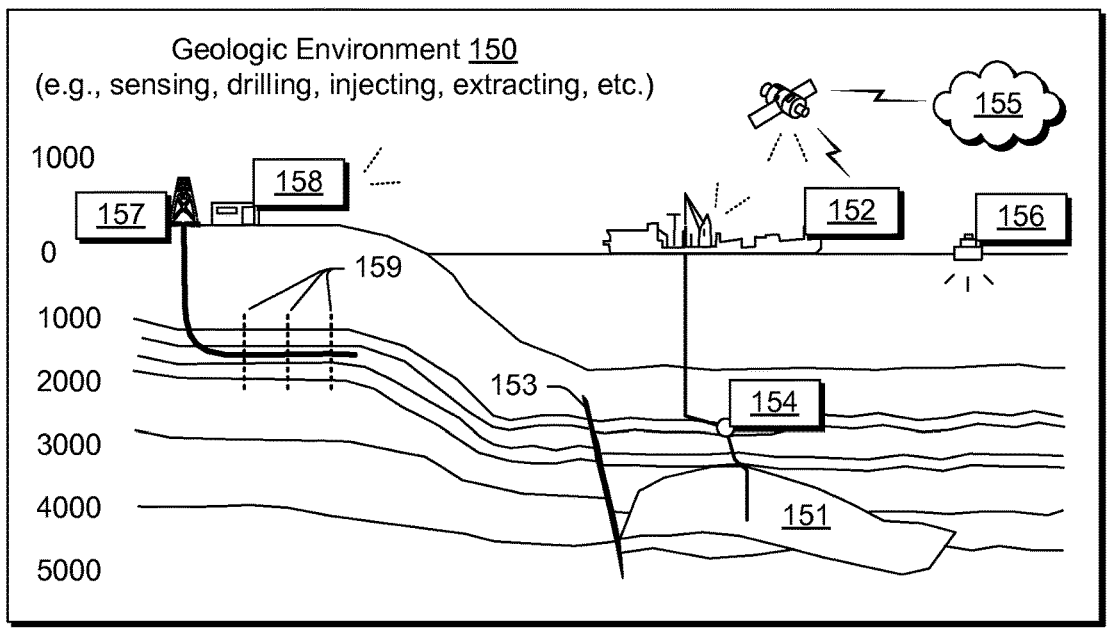

The following description includes the best mode presently contemplated for practicing the described implementations. This description is not to be taken in a limiting sense, but rather is made merely for the purpose of describing the general principles of the implementations. The scope of the described implementations should be ascertained with reference to the issued claims.

As an example, structures in a subterranean environment may be understood better through acquisition of data and processing of acquired data. As an example, data may be one or more of seismic data, imagery data and/or one or more other types of data.

As an example, data may be analyzed to uncover fractures, faults or other structures. As an example, data may be analyzed to uncover a fracture network of multiple fractures that include intersections. As an example, fractures of a fracture network may be formed when rock is stressed or strained, for example, responsive to forces associated with plate-tectonic activity. Fractures may be formed, as an example, using artificial techniques, for example, via hydraulic fracturing. As an example, a fracture network may include natural fractures, artificial fractures or natural fractures and artificial fractures. As an example, fracture networks may contribute a formations' storage (e.g., via porosity, etc.) and/or fluid flow (e.g., via permeability or transmissibility).

As an example, a fracture network may exist in a so-called unconventional formation. As an example, one or more factors may determine whether a formation may be classified as being unconventional. For example, one or more of porosity, permeability, fluid trapping mechanisms, or other characteristics may be factors of a classification scheme for classifying a formation. As an example, a shale gas formation may be classified as an unconventional formation. Quality of a shale reservoir may depend, for example, on one or more of thickness and extent, organic content, thermal maturity, depth and pressure, fluid saturations, permeability, and/or one or more other factors.

As mentioned, a fracture network may include natural fractures, artificial fractures or natural fractures and artificial fractures. For example, a fracture network in a formation that includes shale may include natural fractures, artificial fractures or natural fractures and artificial fractures. As an example, a priori knowledge of natural fractures and/or existing artificial fractures may facilitate planning, performance, etc. of one or more operations (e.g., drilling, injection, extraction, fracturing, etc.).

Formation modeling may facilitate understanding, for example, as to how a formation may behave (e.g., static and/or dynamic behavior). As an example, modeling may include generating a discrete fracture network (DFN), which may be characterized spatially by porosities, permeabilities, transmissibilities, etc. As an example, one or more characteristics of a DFN may change with respect to time (e.g., consider a temporal model). As an example, a DFN may help in understanding aspects of storage and/or fluid flow in a formation. For example, a dynamic model may include a DFN where movement of fluid may occur at least in part via the DFN. As an example, a DFN may include fractures, faults or fractures and faults.

As an example, a model may be a multidimensional model that includes vertices or nodes that define model elements, which may be, for example, polygons, polyhedra, etc. As an example, a model that includes polygons may be subject to one or more rules, such as, for example, (a) polygons are convex, (b) polygons are connected with other polygons, and (c) polygons approximate structure and make geological sense. For example, as to a fracture, it may be desirable to have a model that includes polygons that approximate the fracture, which may be part of a fracture network.

As an example, where a formation includes a relatively planar fracture, a model that includes polygons may be able to include polygons positioned in a manner that represents the planar fracture, for example, as a surface that may be an individual fracture in DFN. However, where a fracture may differ from such a relatively planar fracture, as an example, an effort to model the fracture may violate one or more rules. For example, a risk may exist that a fracture or fractures get modeled in incorrect positions, incorrect orientations, etc. As an example, a single best fit plane may be insufficient to adequately represent a fracture (e.g., depending on the three-dimensional nature of the fracture).

As an example, a method can include applying a splitting algorithm to split a data-based representation of a fracture surface into parts. In such an example, at least some of the parts may then be approximated, for example, by planes. For example, a fracture surface may be split into parts where each of the parts is approximated by a plane. As an example, adjacent planes may represent adjacent parts of a fracture and may be disposed at different angles, for example, with respect to a locus or loci.

As an example, a method may include transforming a fracture and/or a fault into a set of convex hulls. A convex hull may be defined with respect to a set of points in a number of dimensions such that the convex hull is the intersection of convex sets containing the points.

As an example, a so-called Graham scan may be employed to determine a convex hull of a finite planar set of points. For example, given a finite set of points in a plane, a method may include determining a convex hull of the finite set of points. A Graham scan can determine which points in a set of points may be extreme points of a convex hull, which may define a convex hull (e.g., a boundary for a plane). As an example, a method may include one or more procedures such as (i) finding a point P in a plane that is in the interior of a convex hull of a finite set of points, (ii) expressing each point in the finite set of points in polar coordinates with an origin at the point P and with a polar coordinate θ of approximately null in a direction of an arbitrary fixed half-line from the point P, (iii) ordering elements $\rho_k \exp i\theta_k$ of the finite set of points in terms of increasing $\theta_k$, (iv) deleting points based on one or more criteria to arrive at a reduced set of points, and (v) processing the reduced set of points to arrive at a subset of the original finite set of points where the subset is made of so-called extreme points of the convex hull.

As an example, given a set of points, a Graham scan algorithm may compute a convex hull, for example, by finding an extreme point, which serves as a pivot point on the convex hull, which may be selected to be the point with the largest coordinate value (e.g., in a coordinate dimension), sorting the points in order of increasing angle about the pivot point to arrive at a star-shaped polygon (e.g., or a portion thereof) where the pivot point can "see" the segments and points of the star-shaped polygon (e.g., a convexity condition), and building the convex hull by marching around the star-shaped polygon (e.g., or portion thereof) and adding edges when making a left turn and back-tracking when making a right turn (e.g., or vice versa depending on coordinate system definition).

As an example, a fracture or a fault may be indicated by a curve, a line, points, etc. As an example, the fracture or the fault may be split according to an angle criterion. For example, the angle may be implemented to analyze the fracture or the fault with respect to one or more criteria. In such an example, where a change exists that meets and/or exceeds a value of an angle criterion, a portion of the fracture or the fault may be split, for example, into two sub-portions. As an example, processing may result in a number of sub-portions where each of the sub-portions may be adjacent to at least one other sub-portion. As an example, one or more patches may exist, for example, between two sub-portions.

As an example, sub-portions may be defined by a finite set of points. In such an example, an algorithm may be applied to generate a convex hull. As an example, sub-portions may be processed to find a best fit plane for each of the sub-portions where an algorithm may be applied to generate a convex hull using points of the best fit plane.

As an example, a set of convex hulls may be used to form, at least in part, a DFN, for example, as part of a workflow. As an example, a process may be implemented to generate one or more attribute cubes from raw of processed seismic data. As an example, a process may be implemented to extract features (e.g., fractures, faults, etc.) from one or more attribute cubes (e.g., optionally in an automated manner and/or a semi-automated manner). As an example, a workflow may include interpreting one or more structures using processed data, optionally with further processing. As an example, a workflow may include performing a DFN conversion to convert fractures into a DFN model. As an example, a method may include performing one or more simulations using a DFN model. As an example, a method may include performing one or more actions based at least in part on simulation results.

FIG. 1 shows an example of a system 100 that includes various management components 110 to manage various aspects of a geologic environment 150 (e.g., an environment that includes a sedimentary basin, a reservoir 151, one or more fractures 153, etc.). For example, the management components 110 may allow for direct or indirect management of sensing, drilling, injecting, extracting, etc., with respect to the geologic environment 150. In turn, further information about the geologic environment 150 may become available as feedback 160 (e.g., optionally as input to one or more of the management components 110).

In the example of FIG. 1, the management components 110 include a seismic data component 112, an additional information component 114 (e.g., well/logging data), a processing component 116, a simulation component 120, an attribute component 130, an analysis/visualization component 142 and a workflow component 144. In operation, seismic data and other information provided per the components 112 and 114 may be input to the simulation component 120.

In an example embodiment, the simulation component 120 may rely on entities 122. Entities 122 may include earth entities or geological objects such as wells, surfaces, reservoirs, etc. In the system 100, the entities 122 can include virtual representations of actual physical entities that are reconstructed for purposes of simulation. The entities 122 may include entities based on data acquired via sensing, observation, etc. (e.g., the seismic data 112 and other information 114). An entity may be characterized by one or more properties (e.g., a geometrical pillar grid entity of an earth model may be characterized by a porosity property). Such properties may represent one or more measurements (e.g., acquired data), calculations, etc.

In an example embodiment, the simulation component 120 may rely on a software framework such as an object-based framework. In such a framework, entities may include entities based on pre-defined classes to facilitate modeling and simulation. A commercially available example of an object-based framework is the MICROSOFT® .NET™ framework (Redmond, Wash.), which provides a set of extensible object classes. In the .NET™ framework, an object class encapsulates a module of reusable code and associated data structures. Object classes can be used to instantiate object instances for use in by a program, script, etc. For example, borehole classes may define objects for representing boreholes based on well data.

In the example of FIG. 1, the simulation component 120 may process information to conform to one or more attributes specified by the attribute component 130, which may include a library of attributes. Such processing may occur prior to input to the simulation component 120 (e.g., consider the processing component 116). As an example, the simulation component 120 may perform operations on input information based on one or more attributes specified by the attribute component 130. In an example embodiment, the simulation component 120 may construct one or more models of the geologic environment 150, which may be relied on to simulate behavior of the geologic environment 150 (e.g., responsive to one or more acts, whether natural or artificial). In the example of FIG. 1, the analysis/visualization component 142 may allow for interaction with a model or model-based results. As an example, output from the simulation component 120 may be input to one or more other workflows, as indicated by a workflow component 144.

As an example, the simulation component 120 may include one or more features of a simulator such as the ECLIPSE™ reservoir simulator (Schlumberger Limited, Houston Tex.), the INTERSECT™ reservoir simulator (Schlumberger Limited, Houston Tex.), etc. As an example, a reservoir or reservoirs may be simulated with respect to one or more enhanced recovery techniques (e.g., consider a thermal process such as SAGD, etc.).

In an example embodiment, the management components 110 may include features of a commercially available simulation framework such as the PETREL® seismic to simulation software framework (Schlumberger Limited, Houston, Tex.). The PETREL® framework provides components that allow for optimization of exploration and development operations. The PETREL® framework includes seismic to simulation software components that can output information for use in increasing reservoir performance, for example, by improving asset team productivity. Through use of such a framework, various professionals (e.g., geophysicists, geologists, and reservoir engineers) can develop collaborative workflows and integrate operations to streamline processes. Such a framework may be considered an application and may be considered a data-driven application (e.g., where data is input for purposes of simulating a geologic environment).

In an example embodiment, various aspects of the management components 110 may include add-ons or plug-ins that operate according to specifications of a framework environment. For example, a commercially available framework environment marketed as the OCEAN® framework environment (Schlumberger Limited, Houston, Tex.) allows for integration of add-ons (or plug-ins) into a PETREL® framework workflow. The OCEAN® framework environment leverages .NET® tools (Microsoft Corporation, Redmond, Wash.) and offers stable, user-friendly interfaces for efficient development. In an example embodiment, various components may be implemented as add-ons (or plug-ins) that conform to and operate according to specifications of a framework environment (e.g., according to application programming interface (API) specifications, etc.).

FIG. 1 also shows an example of a framework 170 that includes a model simulation layer 180 along with a framework services layer 190, a framework core layer 195 and a modules layer 175. The framework 170 may include the commercially available OCEAN® framework where the model simulation layer 180 is the commercially available PETREL® model-centric software package that hosts OCEAN® framework applications. In an example embodiment, the PETREL® software may be considered a data-driven application. The PETREL® software can include a framework for model building and visualization. Such a model may include one or more grids.

The model simulation layer 180 may provide domain objects 182, act as a data source 184, provide for rendering 186 and provide for various user interfaces 188. Rendering 186 may provide a graphical environment in which applications can display their data while the user interfaces 188 may provide a common look and feel for application user interface components.

In the example of FIG. 1, the domain objects 182 can include entity objects, property objects and optionally other objects. Entity objects may be used to geometrically represent wells, surfaces, reservoirs, etc., while property objects may be used to provide property values as well as data versions and display parameters. For example, an entity object may represent a well where a property object provides log information as well as version information and display information (e.g., to display the well as part of a model).

In the example of FIG. 1, data may be stored in one or more data sources (or data stores, generally physical data storage devices), which may be at the same or different physical sites and accessible via one or more networks. The model simulation layer 180 may be configured to model projects. As such, a particular project may be stored where stored project information may include inputs, models, results and cases. Thus, upon completion of a modeling session, a user may store a project. At a later time, the project can be accessed and restored using the model simulation layer 180, which can recreate instances of the relevant domain objects.

In the example of FIG. 1, the geologic environment 150 may include layers (e.g., stratification) that include a reservoir 151 and that may be intersected by a fault 153. As an example, the geologic environment 150 may be outfitted with any of a variety of sensors, detectors, actuators, etc. For example, equipment 152 may include communication circuitry to receive and to transmit information with respect to one or more networks 155. Such information may include information associated with downhole equipment 154, which may be equipment to acquire information, to assist with resource recovery, etc. Other equipment 156 may be located remote from a well site and include sensing, detecting, emitting or other circuitry. Such equipment may include storage and communication circuitry to store and to communicate data, instructions, etc. As an example, one or more satellites may be provided for purposes of communications, data acquisition, etc. For example, FIG. 1 shows a satellite in communication with the network 155 that may be configured for communications, noting that the satellite may additionally or alternatively include circuitry for imagery (e.g., spatial, spectral, temporal, radiometric, etc.).

FIG. 1 also shows the geologic environment 150 as optionally including equipment 157 and 158 associated with a well that includes a substantially horizontal portion that may intersect with one or more fractures 159. For example, consider a well in a shale formation that may include natural fractures, artificial fractures (e.g., hydraulic fractures) or a combination of natural and artificial fractures. As an example, a well may be drilled for a reservoir that is laterally extensive. In such an example, lateral variations in properties, stresses, etc. may exist where an assessment of such variations may assist with planning, operations, etc. to develop the reservoir (e.g., via fracturing, injecting, extracting, etc.). As an example, the equipment 157 and/or 158 may include components, a system, systems, etc. for fracturing, seismic sensing, analysis of seismic data, assessment of one or more fractures, etc.

As mentioned, the system 100 may be used to perform one or more workflows. A workflow may be a process that includes a number of worksteps. A workstep may operate on data, for example, to create new data, to update existing data, etc. As an example, a may operate on one or more inputs and create one or more results, for example, based on one or more algorithms. As an example, a system may include a workflow editor for creation, editing, executing, etc. of a workflow. In such an example, the workflow editor may provide for selection of one or more pre-defined worksteps, one or more customized worksteps, etc. As an example, a workflow may be a workflow implementable in the PETREL® software, for example, that operates on seismic data, seismic attribute(s), etc. As an example, a workflow may be a process implementable in the OCEAN® framework. As an example, a workflow may include one or more worksteps that access a module such as a plug-in (e.g., external executable code, etc.).

Figure 2:
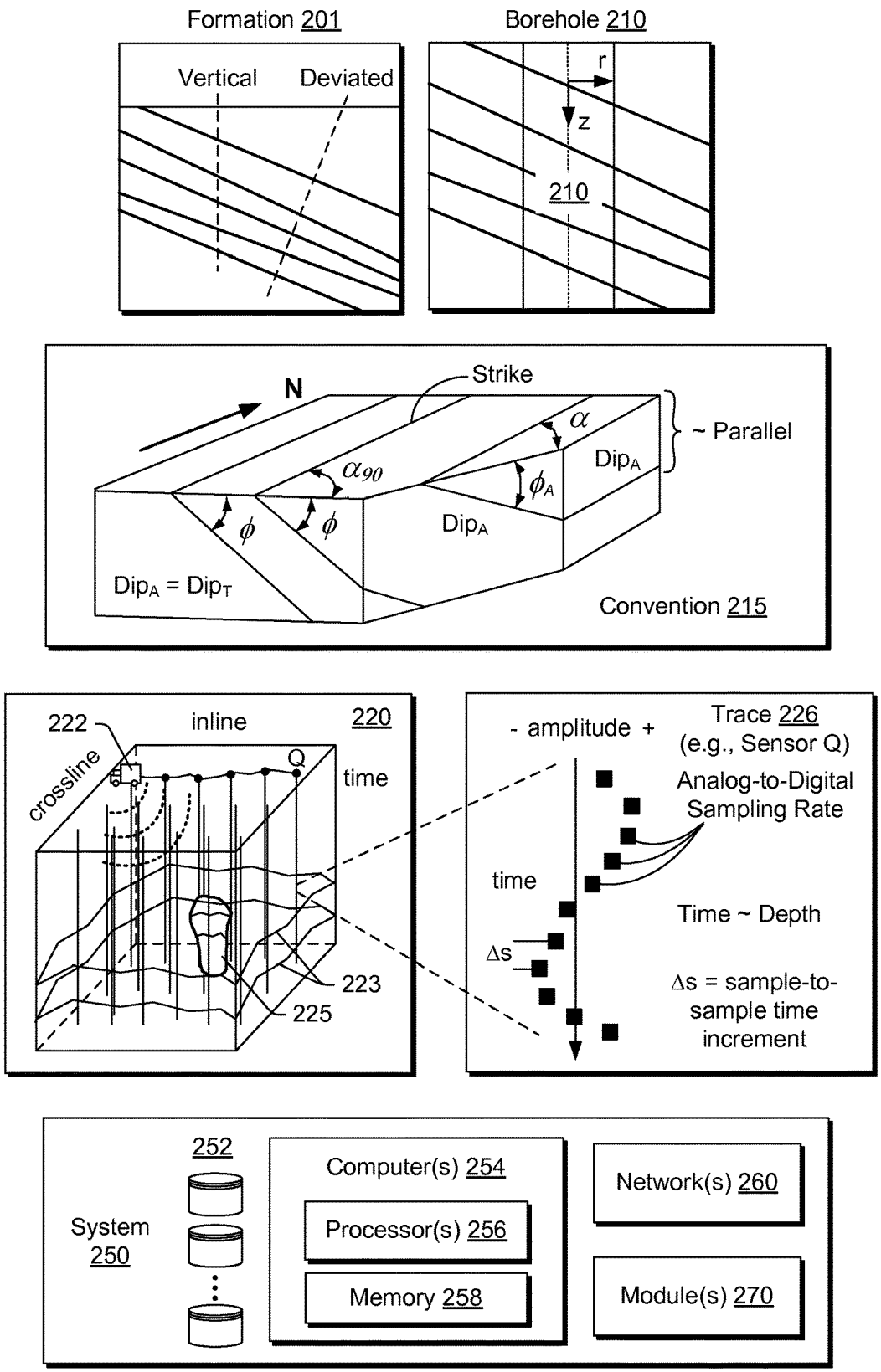
FIG. 2 illustrates examples of formations, an example of a convention for dip, an example of data acquisition, and an example of a system.

FIG. 2 shows an example of a formation 201, an example of a borehole 210, an example of a convention 215 for dip, an example of a data acquisition process 220, and an example of a system 250.

As shown, the formation 201 includes a horizontal surface and various subsurface layers. As an example, a borehole may be vertical. As another example, a borehole may be deviated. In the example of FIG. 2, the borehole 210 may be considered a vertical borehole, for example, where the z-axis extends downwardly normal to the horizontal surface of the formation 201.

As to the convention 215 for dip, as shown, the three dimensional orientation of a plane can be defined by its dip and strike. Dip is the angle of slope of a plane from a horizontal plane (e.g., an imaginary plane) measured in a vertical plane in a specific direction. Dip may be defined by magnitude (e.g., also known as angle or amount) and azimuth (e.g., also known as direction). As shown in the convention 215 of FIG. 2, various angles ϕ indicate angle of slope downwards, for example, from an imaginary horizontal plane (e.g., flat upper surface); whereas, azimuth refers to the direction towards which a dipping plane slopes (e.g., which may be given with respect to degrees, compass directions, etc.). Another feature shown in the convention of FIG. 2 is strike, which is the orientation of the line created by the intersection of a dipping plane and a horizontal plane (e.g., consider the flat upper surface as being an imaginary horizontal plane).

Some additional terms related to dip and strike may apply to an analysis, for example, depending on circumstances, orientation of collected data, etc. One term is "true dip" (see, e.g., $Dip_T$ in the convention 215 of FIG. 2). True dip is the dip of a plane measured directly perpendicular to strike (see, e.g., line directed northwardly and labeled "strike" and angle $\alpha_{90}$) and also the maximum possible value of dip magnitude. Another term is "apparent dip" (see, e.g., $Dip_A$ in the convention 215 of FIG. 2). Apparent dip may be the dip of a plane as measured in any other direction except in the direction of true dip (see, e.g., $\phi_A$ as $Dip_A$ for angle $\alpha$); however, it is possible that the apparent dip is equal to the true dip (see, e.g., $\alpha$ as $Dip_A = Dip_T$ for angle $\alpha_{90}$ with respect to the strike). In other words, where the term apparent dip is used (e.g., in a method, analysis, algorithm, etc.), for a particular dipping plane, a value for "apparent dip" may be equivalent to the true dip of that particular dipping plane.

As shown in the convention 215 of FIG. 2, the dip of a plane as seen in a cross-section exactly perpendicular to the strike is true dip (see, e.g., the surface with $\phi$ as $Dip_A = Dip_T$ for angle $\alpha_{90}$ with respect to the strike). As indicated, dip observed in a cross-section in any other direction is apparent dip (see, e.g., surfaces labeled $Dip_A$). Further, as shown in the convention 215 of FIG. 2, apparent dip may be approximately 0 degrees (e.g., parallel to a horizontal surface where an edge of a cutting plane runs along a strike direction).

In terms of observing dip in wellbores, true dip is observed in wells drilled vertically. In wells drilled in any other orientation (or deviation), the dips observed are apparent dips (e.g., which are referred to by some as relative dips). In order to determine true dip values for planes observed in such boreholes, as an example, a vector computation (e.g., based on the borehole deviation) may be applied to one or more apparent dip values.

As mentioned, another term that finds use in sedimentological interpretations from borehole images is "relative dip" (e.g., $Dip_R$). A value of true dip measured from borehole images in rocks deposited in very calm environments may be subtracted (e.g., using vector-subtraction) from dips in a sand body. In such an example, the resulting dips are called relative dips and may find use in interpreting sand body orientation.

A convention such as the convention 215 may be used with respect to an analysis, an interpretation, an attribute, etc. (see, e.g., various blocks of the system 100 of FIG. 1). As an example, various types of features may be described, in part, by dip (e.g., sedimentary bedding, faults and fractures, cuestas, igneous dikes and sills, metamorphic foliation, etc.).

Seismic interpretation may aim to identify and classify one or more subsurface boundaries based at least in part on one or more dip parameters (e.g., angle or magnitude, azimuth, etc.). As an example, various types of features (e.g., sedimentary bedding, faults and fractures, cuestas, igneous dikes and sills, metamorphic foliation, etc.) may be described at least in part by angle, at least in part by azimuth, etc.

As shown in the diagram 220 of FIG. 2, a geobody 225 may be present in a geologic environment. For example, the geobody 225 may be a salt dome. A salt dome may be a mushroom-shaped or plug-shaped diapir made of salt and may have an overlying cap rock (e.g., or caprock). Salt domes can form as a consequence of the relative buoyancy of salt when buried beneath other types of sediment. Hydrocarbons may be found at or near a salt dome due to formation of traps due to salt movement in association evaporite mineral sealing. Buoyancy differentials can cause salt to begin to flow vertically (e.g., as a salt pillow), which may cause faulting. In the diagram 220, the geobody 225 is met by layers which may each be defined by a dip angle $\phi$.

As an example, seismic data may be acquired for a region in the form of traces. In the example of FIG. 2, the diagram 220 shows acquisition equipment 222 emitting energy from a source (e.g., a transmitter) and receiving reflected energy via one or more sensors (e.g., receivers) strung along an inline direction. As the region includes layers 223 and the geobody 225, energy emitted by a transmitter of the acquisition equipment 222 can reflect off the layers 223 and the geobody 225. Evidence of such reflections may be found in the acquired traces. As to the portion of a trace 226, energy received may be discretized by an analog-to-digital converter that operates at a sampling rate. For example, the acquisition equipment 222 may convert energy signals sensed by sensor Q to digital samples at a rate of one sample per approximately 4 ms. Given a speed of sound in a medium or media, a sample rate may be converted to an approximate distance. For example, the speed of sound in rock may be of the order of around 5 km per second. Thus, a sample time spacing of approximately 4 ms would correspond to a sample "depth" spacing of about 10 meters (e.g., assuming a path length from source to boundary and boundary to sensor). As an example, a trace may be about 4 seconds in duration; thus, for a sampling rate of one sample at about 4 ms intervals, such a trace would include about 1000 samples where latter acquired samples correspond to deeper reflection boundaries. If the 4 second trace duration of the foregoing example is divided by two (e.g., to account for reflection), for a vertically aligned source and sensor, the deepest boundary depth may be estimated to be about 10 km (e.g., assuming a speed of sound of about 5 km per second).

In the example of FIG. 2, the system 250 includes one or more information storage devices 252, one or more computers 254, one or more networks 260 and one or more modules 270. As to the one or more computers 254, each computer may include one or more processors (e.g., or processing cores) 256 and memory 258 for storing instructions (e.g., modules), for example, executable by at least one of the one or more processors. As an example, a computer may include one or more network interfaces (e.g., wired or wireless), one or more graphics cards, a display interface (e.g., wired or wireless), etc.

In the example of FIG. 2, the one or more memory storage devices 252 may store seismic data for a geologic environment that spans kilometers in length and width and, for example, around 10 km in depth. Seismic data may be acquired with reference to a surface grid (e.g., defined with respect to inline and crossline directions). For example, given grid blocks of about 40 meters by about 40 meters, a 40 km by 40 km field may include about one million traces. Such traces may be considered 3D seismic data where time approximates depth. As an example, a computer may include a network interface for accessing seismic data stored in one or more of the storage devices 252 via a network. In turn, the computer may process the accessed seismic data via instructions, which may be in the form of one or more modules.

As an example, one or more attribute modules may be provided for processing seismic data. As an example, attributes may include geometrical attributes (e.g., dip angle, azimuth, continuity, seismic trace, etc.). Such attributes may be part of a structural attributes library (see, e.g., the attribute component 130 of FIG. 1). Structural attributes may assist with edge detection, local orientation and dip of seismic reflectors, continuity of seismic events (e.g., parallel to estimated bedding orientation), etc. As an example, an edge may be defined as a discontinuity in horizontal amplitude continuity within seismic data and correspond to a fault, a fracture, etc. Geometrical attributes may be spatial attributes and rely on multiple traces.

As mentioned, as an example, seismic data for a region may include one million traces where each trace includes one thousand samples for a total of one billion samples. Resources involved in processing such seismic data in a timely manner may be relatively considerable by today's standards. As an example, a dip scan approach may be applied to seismic data, which involves processing seismic data with respect to discrete planes (e.g., a volume bounded by discrete planes). Depending on the size of the seismic data, such an approach may involve considerable resources for timely processing. Such an approach may look at local coherence between traces and their amplitudes, and therefore may be classified in the category of "apparent dip."

As an example, imagery such as surface imagery (e.g., satellite, geological, geophysical, etc.) may be processed. As an example, a method may analyze imagery using a splitting technique and may include generating a set of convex hulls, which may represent, for example, one or more structures (e.g., portions of a fracture, portions of a fault, etc.). As an example, a framework may access surface imagery and may access sub-surface seismic data and generate a three-dimensional representation (e.g., for visualization) of surface structure and sub-surface structure, which may be joined via an interpolation process or other process. For example, a latent structure may be captured by seismology and by satellite imagery and a model constructed based at least in part on analysis of seismic data and surface imagery.

As an example, ant-tracking may be performed as part of a workflow. As an example, ant-tracking may generate an ant-tracking attribute, an ant-tracking surface, an ant-tracking volume (e.g., or cube), etc. Ant-tracking may include using an algorithm that by analogy, involves "ants" finding the shortest path between their nest and their food source (e.g., by communicating using pheromones to attract other ants). In such an example, the shortest path becomes marked with more pheromones than longer paths such that subsequent ants are more likely to choose the shortest path, and so on.

Where features may be latent (e.g., latent structure), for example, due to noise, acquisition footprint, etc., performing an analysis prior to ant-tracking may enhance the ability to track the latent features, particularly where the features have some amount of continuity (e.g., contiguous within a surface, a volume, etc.). For example, fractures generated by a fracturing process (e.g., consider hydraulic fracturing) may tend to be relatively small (e.g., compared to faults) and contiguous.

As an example, data may be processed using one or more edge detection algorithms. Various edge detection algorithms may include determining gradients (e.g., spatial derivatives of values in a data set). Application of an edge detection algorithm may help uncover and highlight structures in a subterranean environment, for example, for a particular purpose. For example, a workflow may aim to determine whether certain structures exist in a subterranean environment and whether those structures exist in some relationship with respect to other structures.

In various example embodiments, one or more analyses may be applied to data such as seismic data, data derived from seismic data, etc. As an example, a method may include performing one or more analyses to detect features such as, for example, fractures, other latent structures, etc. As an example, analyses may be implemented in a framework as a module, set of modules, etc., for example, to detect faults, fractures, and latent reflections. As an example, one or more analyses may be performed to assist with detection of one or more features of interest in oil and gas exploration and production (E&P). For example, results from an analysis may assist with well placement, geologic modeling, sill analyses, detection of fractured zones or fracture corridors, and in E&P for unconventional resources and carbonate fields (e.g., consider shale fields).

As an example, fracture corridors or subtle faults may give rise to seismic signals that may be exhibited in acquired seismic data as small-amplitude self-incoherent features, for example, in cross sections and as lineaments on slices or seismic surfaces. Detection of such features may include processing seismic signals, seismic data or both to generate one or more edge detection attributes, for example, where an attribute may be considered a measurable "property" of seismic data (e.g., consider amplitude, dip, frequency, phase, polarity, etc.). For example, an attribute may be a value or a set of values derived from seismic signals, seismic data, etc. and defined with respect to a coordinate system (e.g., one-dimensional, two-dimensional, three-dimensional, four-dimensional or of an even higher dimension). As an example, a dimension may be a spatial dimension, a time dimension, a frequency dimension, etc. As an example, consider providing seismic data as a "cube" where each voxel (volume element) in the cube has a value. In such an example, an edge detection algorithm may process the values in a cube to generate new values where the new values are referred to collectively as an edge detection attribute (e.g., an attribute cube).

As an example, a seismic cube (e.g., a seismic volume or seismic data for a volume) may be processed to generate an attribute cube (e.g., an attribute volume or attribute values for a volume). As another example, a seismic surface may be processed to generate an attribute surface. As yet another example, a seismic line may be processed to generate an attribute line. As an example, a seismic point may be processed to generate an attribute point.

Attributes may be derived, measured, etc., for example, at one instant in time, for multiple instances in time, over a time window, etc. and, for example, may be measured on a single trace, on a set of traces, on a surface interpreted from seismic data, etc. Attribute analysis may include assessment of various parameters, for example, as to a reservoir, consider a hydrocarbon indicator derived from an amplitude variation with offset (AVO) analysis (e.g., or amplitude variation with angle (AVA), etc.).

As an example, a model may be a seismic discontinuity plane model (e.g., an "SDP" model), which may be derived from seismic data (e.g., raw data, one or more attributes, etc.). As an example, a method may include using seismic discontinuity planes (SDP) for performing a discrete fracture network (DFN) conversion to generate a DFN model. As an example, a method may be implemented where complex fracture surfaces may be represented, for example, by lists of points (e.g., at different depths).

As an example, one or more SDPs may be extracted from a seismic attribute cube or cubes. In such an example, an SDP may "physically" (e.g., spatially) follow information derived from seismic data, which includes signal information that may zigzag, be wavy, etc. Thus, an SDP may zigzag, be wavy, etc. As to a DFN model, it may approximate an interpretation of natural and/or induced fractures. For example, a DFN model can include a family of convex planar polygons that are amenable to one or more numerical modeling techniques. A DFN model can include "patches" that represent fractures where an individual fracture may be represented by one or more convex planar polygons. As an example, a method can include transforming an SDP model (e.g., with wavy surfaces, etc.) to a DFN model (e.g., with convex polygonal surfaces).

As an example, a transformation can include receiving a multi-faceted SDP model where such facets may be oriented differently. In such an example, a method can include splitting the SDP model on a facet-by-facet basis, for example, based at least in part on facet orientation. As an example, a method can aim to generate a set or sets of split facets that maintain fracture density and orientation relatively consistent with that of the SDP model being split. Such a process may be implemented, for example, for purposes of quality control. For example, an analysis may compare split facets to one or more SDPs (e.g., using one or more spatial criteria). In such an example, one or more splitting parameters may be adjusted to achieve a desire level of consistency between the one or more SDPs and facets split therefrom. Such a process may, for example, allow for tailoring a DFN model formed at least in part by facets split from a SDP model.

As an example, a DFN model may include patches that conform to one or more connectivity criteria. For example, consider a connectivity criterion that states that adjacent patches in a DFN model are to be connected with each other, for example, where they belong to two adjacent parts of the same SDP before splitting.

As an example, a fracture network may be analyzed to generate a plurality of SDPs that may form one or more SDP models. As an example, a SDP model may include of the order of thousands of SDPs (e.g., possibly one hundred thousand or more SDPs may be included in an SDP model of a fracture network). As to transforming an SDP model to a DFN model, as an example, consider a model that includes 100,000 SDPs that are to be split to form patches for the DFN model. In such an example, if an individual SDP takes about one second to process, the 100,000 SDPs may take about 100,000 seconds collectively (e.g., more than about 10 days).

As an example, a method can include transforming a SDP model to convex polygons suitable for use as DFN model patches. Such a method may include one or more algorithms that can be implemented in serial and/or in parallel. As an example, a method may include one or more branches, for example, to analyze a SDP, or a portion thereof, and then decide whether to process the SDP, or a portion thereof, using one or more techniques. In such an example, an SDP, or a portion thereof, may be subject to one or more splitting process, which may vary in terms of demand of computational resources.

As an example, a method may decide to implement a best fit plane process as to an SDP to generate a convex planar polygon suitable for use as a patch in a DFN model. As an example, a method may decide to implement a different process as to an SDP, or a portion thereof, where, for example, a reservoir may be a fractured, unconventional reservoir (e.g., such that multiple polygons approximate an SDP).

As an example, a method may include a polygon criterion, for example, consider a maximum polygon number per SDP, a maximum polygon density per SDP, etc. For example, a maximum polygon number per SDP may be of the order of ten or tens of polygons per SDP. As an example, a method may include a rose diagram analysis that may be applied to polygons resulting from a process that splits SDPs into polygons. For example, a rose diagram analysis may show dip and azimuth distribution (e.g., of a fracture network). As an example, one or more polygon criteria may be adjusted based at least in part on a rose diagram analysis.

Figure 3:
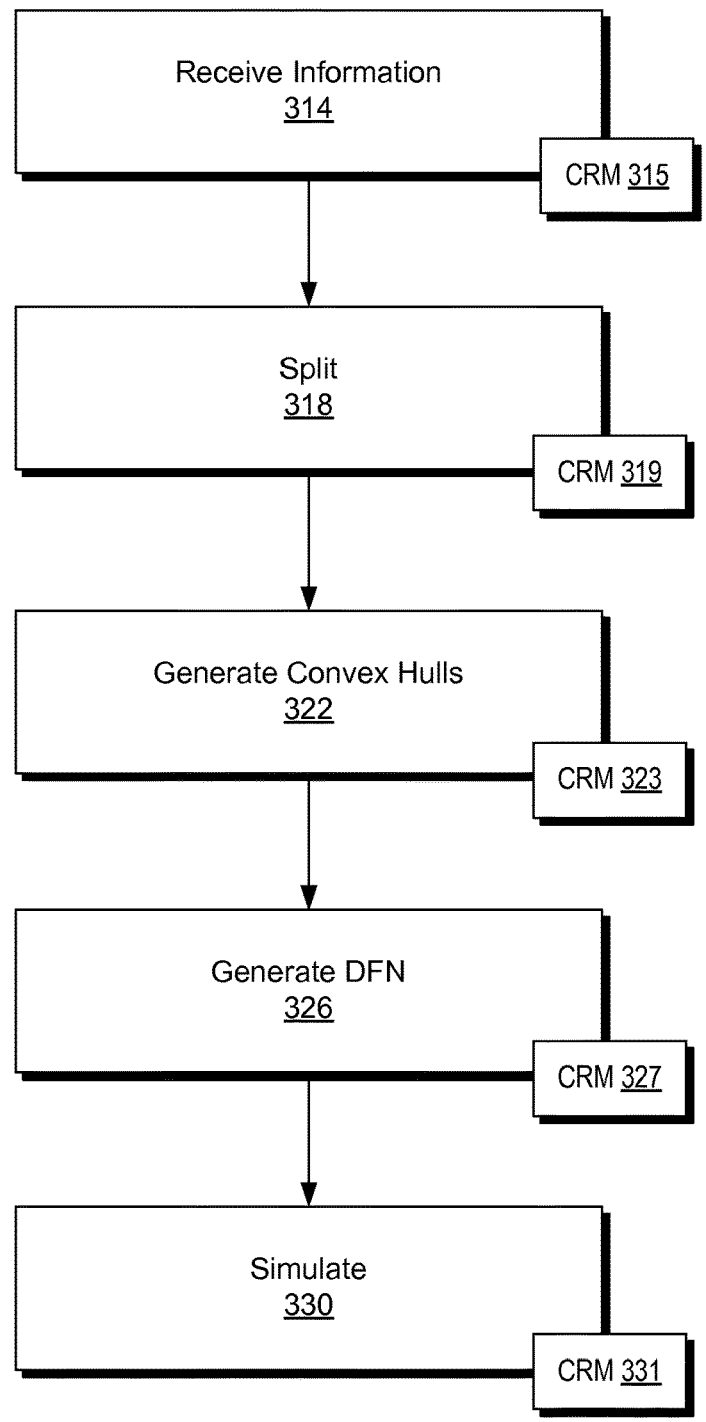
FIG. 3 illustrates an example of a method.

FIG. 3 shows an example of a method 310 that includes a reception block 314 for receiving information that defines a three-dimensional subterranean structure, a split block 318 for splitting the subterranean structure into portions, a generation block 322 for generating convex hulls for the portions, a generation block 326 for generating a discrete fracture network (DFN) based at least in part on the convex hulls and a simulation block 330 for simulating phenomena associated with a subterranean formation based at least in part on a model that includes the discrete fracture network (DFN).

The method 310 is shown in FIG. 3 in association with various computer-readable medium (CRM) blocks 315, 319, 323, 327 and 331. Such blocks generally include instructions suitable for execution by one or more processors (or processor cores) to instruct a computing device or system to perform one or more actions. While various blocks are shown, a single medium may be configured with instructions to allow for, at least in part, performance of various actions of the method 300. As an example, a computer-readable medium (CRM) may be a computer-readable storage medium. As an example, a computer-readable medium may be non-transitory and not a carrier wave.

As an example, the method 310, or a portion thereof, may be optionally implemented as a plug-in to a framework. For example, consider a plug-in to the OCEAN® framework that can generate convex hulls (e.g., per the generation block 322 of FIG. 3). In such an example, the framework may include one or more modules that can build at least a portion of a DFN based at least in part on such convex hulls.

As an example, a method may include converting complex fractures into a discrete fracture network (DFN), which may be in a data format suitable for fault and fracture modeling (e.g., in unconventional reservoir or other reservoir).

As an example, a fault and fracture model (e.g., represented by a DFN or DFNs) may assist with exploration and exploitation of a reservoir or reservoirs. As an example, a seismic-to-simulation framework may be configured for input of a DFN or DFNs.

As an example, a reservoir may include many fractures. For example, a reservoir may include of the order of tens of thousands of fractures. As an example, a method that includes splitting may be implemented to split a fracture surface into parts where each part may, for example, be approximated by a best fit plane. As an example, a splitting algorithm may include an adjustable angle parameter, which may have a default value, may be determined via a learning algorithm, may be set via a user interface (e.g., a graphical user interface, etc.).

As an example, a splitting method may assume that a complex surface may be split based on an angle. In such an example, a trend change in a selected direction (e.g., horizontal direction) larger than the angle may call for splitting of the surface. As an example, for a relatively smooth curved surface, parts resulting from splitting may retain connections with each other. As an example, a Graham scan algorithm may be employed to determine a convex hull for each part (e.g., based on a best fit plane for each part of the split surface). A set of convex hulls may be provided as a basis for forming a DFN model. Accordingly, as an example, a method can include converting a complex fracture surface or surfaces to convex planar polygons that may be used to form at least part of a DFN model.

Figure 4:
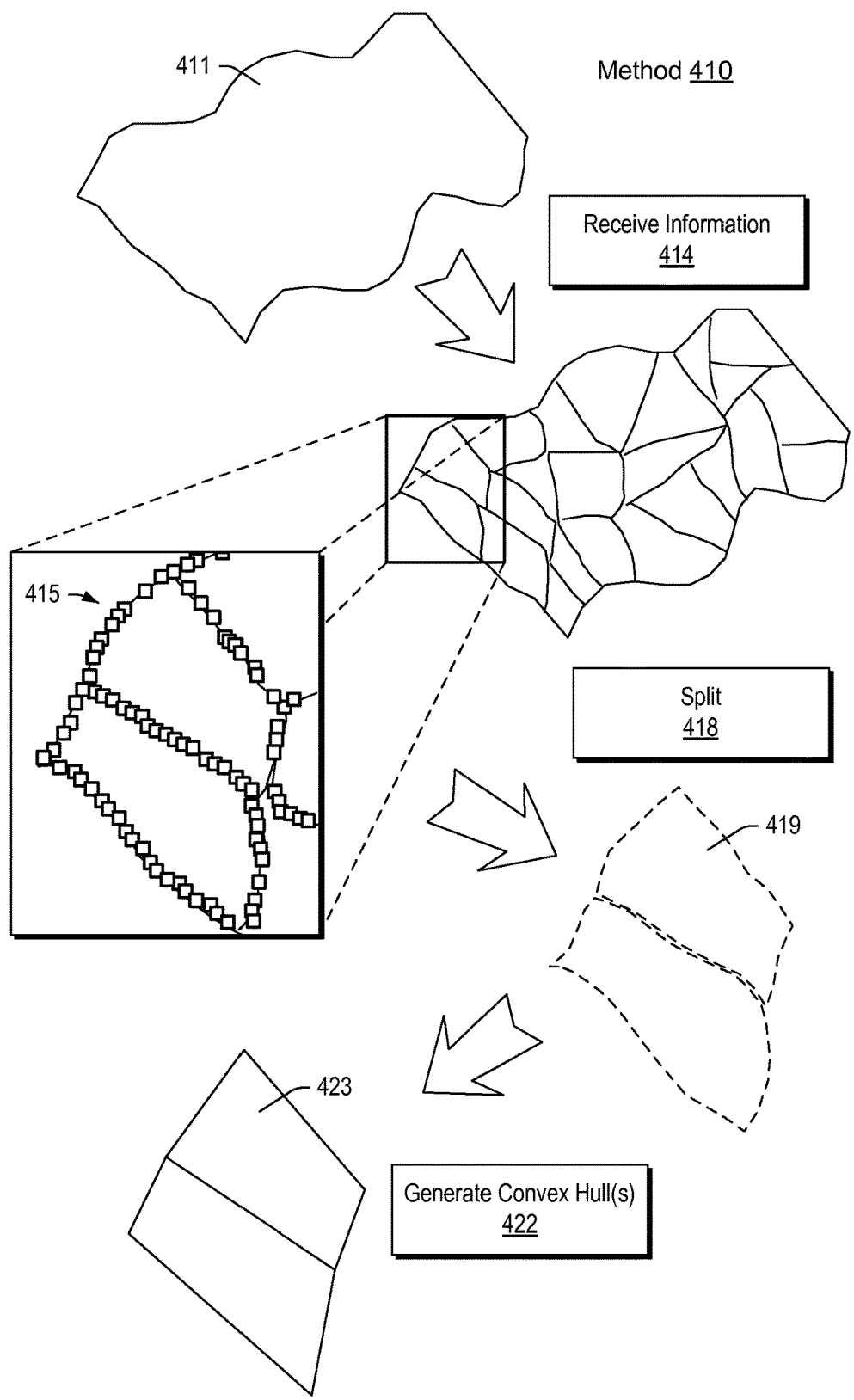
FIG. 4 illustrates an example of a method.

FIG. 4 shows an example of a method 410 and approximate illustrations of information 411 that defines a subterranean structure, points in space 415, an area 419 that is defined at least in part via points in space, and a convex hull 423 that may be defined at least in part via points in space associated with the area 419. As shown, the method 410 includes a reception block 414 for receiving information that defines a three-dimensional subterranean structure (e.g., consider the information 411, which may be an SDP, etc.), a split block 418 for splitting at least a portion of the three-dimensional subterranean structure into areas (e.g., consider the area 419, etc.) and a generation block 422 for generating convex hulls for areas (e.g., consider the convex hull 423 of the area 419). As an example, a convex hull may be considered to be a type of proxy (e.g., a refined proxy). As an example, a proxy may be defined by its vertices. For example, a proxy that is a convex pentagon may be defined by five points in space. Thus, an area that is defined by a plurality of points in space such as the points 415 may be represented by a reduced amount of information (e.g., vertices in space of a convex polygon, etc.).

In the example of FIG. 4, the received information may be split using a partitioning process that can define, at least in part, one or more areas. As an example, a proxy may be defined as an area that represents a portion of a subterranean structure (e.g., a fracture that may be part of a fracture network). Such a proxy may be a "lightweight" representation of information such as, for example, seismic data, attribute data, etc. (e.g., spatial data stemming from one or more data acquisition techniques). As an example, seismic data may be processed, interpreted, etc. to form, for example, a set of points in space. As an example, a proxy may be represented spatially (e.g., in a multi-dimensional space) by a set of points that collectively define a convex hull (e.g., a convex planar polygon).

As an example, a proxy may be based at least in part on a set of points in space. In such an example, the set of points may be projected within an area, for example, a set of points may be projected onto a plane (e.g., a planar area, etc.). As an example, a generation process that can generate a convex hull may process a set of points associated with an area (e.g., a planar area, etc.). As an example, a method may include an automatically processing information that, for example, approximates individual areas based at least in part on points in space (e.g., via groupings of points, etc.). For example, in FIG. 4, the points 415 may be used to define one or more areas (e.g., the area 419 and its neighbor, etc.). As an example, a proxy may be such an area or, for example, a proxy may be determined using a best fit plane to a set of points (e.g., via a least squares or other type of fitting technique). As to how a proxy is defined, as an example, a method may include assessing a fit of an area to points in space (e.g., with respect to one or more criteria). As an example, an assessment may consider fit with respect to one or more adjacent areas and/or proxies (e.g., as to connectivity, etc.).

As an example, a method can include receiving an SDP and partitioning the SDP via an area partition process. Such a method may further include looping over areas where, for example, for an individual area, a process may fine tune the area, which may be considered a proxy. For example, consider a process that includes projecting points within an area onto a plane and finding a convex polygon that is within the plane. Such a process may, for example, include an analysis that helps to ensure connectivity. For example, such an analysis may aim to connect adjacent convex polygons (e.g., to adhere to a patch criterion of a DFN model).

Figure 5:
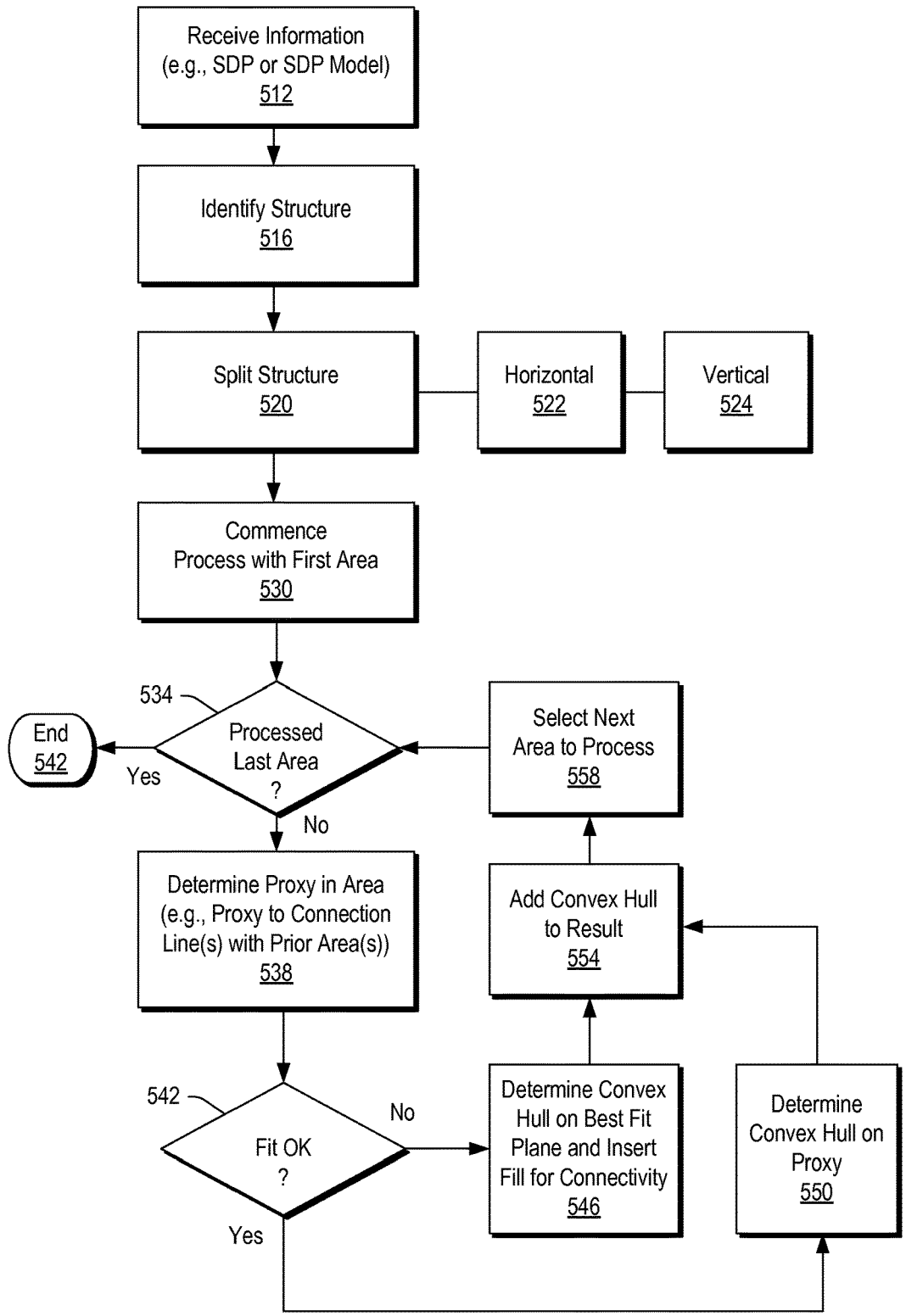
FIG. 5 illustrates an example of a method.

FIG. 5 shows an example of a method 510 that includes a reception block 512 for receiving information (e.g., an SDP, an SDP model, etc.), an identification block 516 for identifying a structure based at least in part on a portion of the information, and a split block 520 for splitting the identified structure. In the example of FIG. 5, the split block 520 may perform splitting in one or more directions. For example, a horizontal split block 522 may provide for splitting via an analysis that assesses a structure with respect to a horizon, horizons, a reference horizontal line or lines, etc.; whereas a vertical split block 524 may provide for splitting via an analysis that assesses a structure with respect to a vertical well, a vertical structure, a reference vertical line or lines, etc.

In the example of FIG. 5, the method 510 includes a commencement block 530 for commencing a loop that can process a plurality of individual areas resulting from a splitting process (e.g., per the split block 520). As shown, the method 510 includes a decision block 534 for deciding whether a last area (e.g., of N areas resulting from splitting a structure) has been processed. Where the decision block 534 decides that a last area has been processed, the method 510 may continue to a termination block 542 (e.g., or other block, workflow, etc.). Where the decision block 534 decides that a last area has not been processed, the method 510 continues to a determination block 538 for determining a proxy as to an area (e.g., current area being processed), which may include determining a proxy according to one or more connectivity criteria that can connect a proxy to a proxy of an adjacent area.

In the example of FIG. 5, the method 510 includes a decision block 542 for deciding whether a proxy achieves an adequate fit with respect to that proxy being part of the identified structure (e.g., per the identification block 516). For example, one or more criteria may be provided for purposes of assessing how well a proxy fits a structure. Such one or more criteria may include spatial criteria, optionally based at least in part on one or more statistically calculated values (e.g., mean, standard deviation, etc.). As an example, the decision block 542 may include assessing fit with respect to one or more connectivity criteria. For example, where a prior proxy exists adjacent to a current proxy, the decision block 542 may determine whether the current proxy is "connected" to the prior proxy. Such a determination may include analyzing an edge of the prior proxy with respect to an edge of the current proxy, for example, as to coincidence, overlap, etc.

As shown, where the decision block 542 decides that the proxy fit is "OK", the method 510 can continue to a determination block 550 for determining a convex hull on the current proxy. As an example, points may be analyzed via a Graham scan technique that can identify "outermost" points within which other may points exist. In such an example, the outermost points can define a convex hull (e.g., a planar, convex polygon). As shown, where the decision block 542 decides that the proxy fit is not "OK", the method 510 can continue to a determination block 546 that can determine a convex hull of a "best" fit plane (e.g., a best fit plane of the current proxy) and that may also include insertion of fill, for example, for purposes of complying with one or more connectivity criteria.

In the example of FIG. 5, where a convex hull or a convex hull and one or more insert fills have been determined, the method 510 may continue at an addition block 554 for adding at least a convex hull to a result (e.g., as a first convex hull or as a subsequent convex hull, optionally with one or more fills). The method 510 may then iterate by selecting another area to process. For example, as shown, a selection block 558 may be included for selecting a next area to process. The method 510 may therefore include a loop with one or more paths, for example, depending on whether one or more fit criteria are met. In the example of FIG. 5, one path may be more computationally demanding than another path. As an example, a ratio of proxies to one path or to another path may depend on received information of the reception block 512, a structure identified per the identification block 516, an identification technique applied by the identification block 516, a splitting technique per the splitting block 520, one or more fit criteria, etc. As an example, a parameter such as a polygon limit parameter, a polygon density parameter, etc. (e.g., of a splitting process, etc.) may be selected and/or adjusted in a manner that can have an effect as to a path taken for a proxy.

In the example of FIG. 5, the reception block 512 may include receiving an SDP. As an example, the method 510 may include outputting (e.g., upon termination per the termination block 542) convex planar polygons, which may be used, for example, as patches of a DFN model. The method 510 may include automatically splitting one or more SDPs of an SDP set (e.g., an SDP model) one-by-one. As an example, a method may be implemented at least in part in parallel. For example, where a SDP model includes a plurality of SDPs, at least a portion of the SDPs may be processed in parallel. As an example, where "patches" are connected, a structure may be processed in serial, for example, in a manner that successively generates convex planar polygons that are added together, optionally with fill to help meet one or more connectivity criteria.

Figure 6:
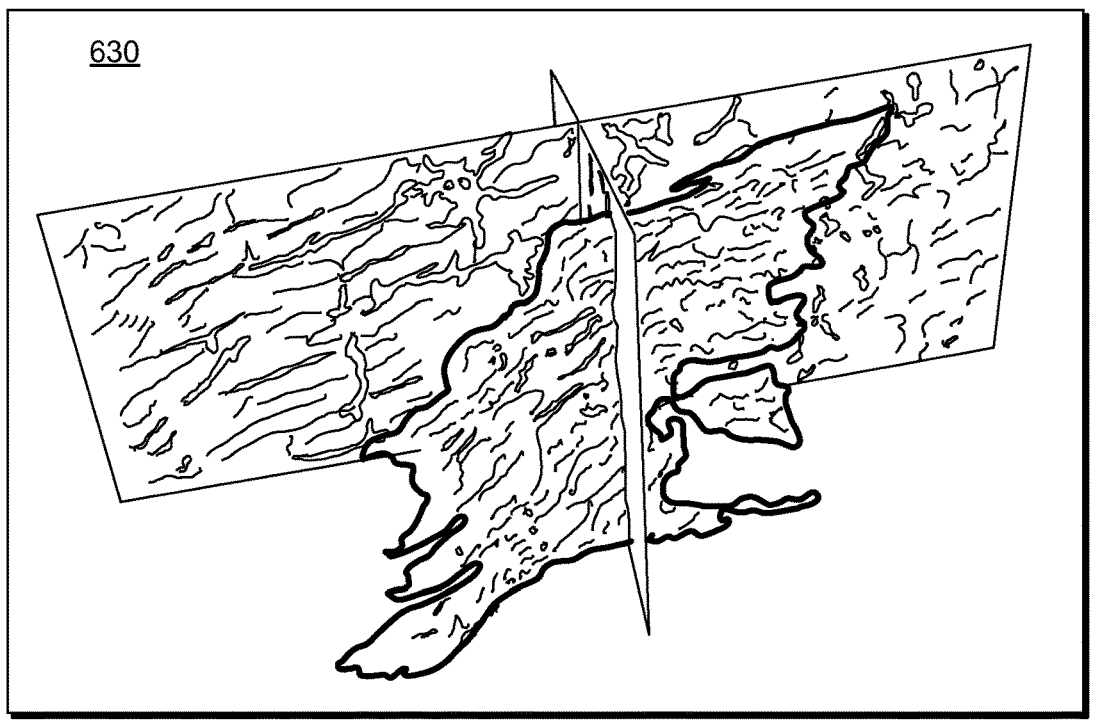
FIG. 6 illustrates examples of data and processed data.
Figure 6:
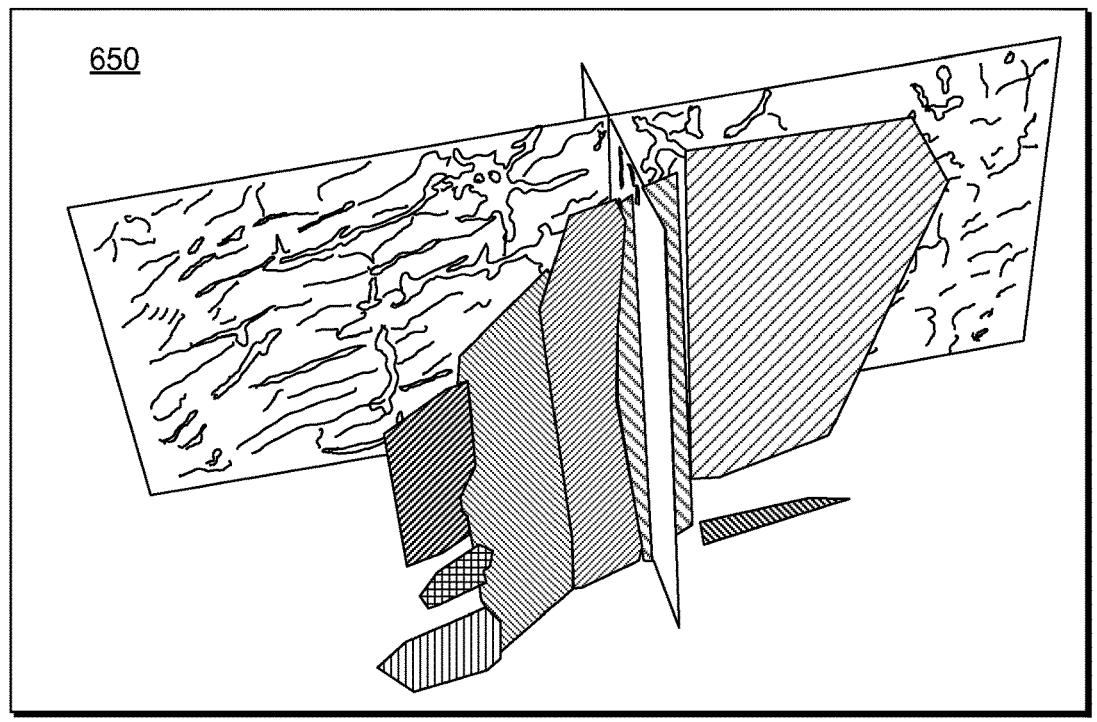

FIG. 6 shows an example of data 630 and processed data 650 that includes a set of convex hulls. As an example, the set of convex hulls may be used to form, at least in part, a DFN model, for example, where individual portions of a fracture network are represented as convex planar polygons. As an example, a method can include receiving data and processing the data to generate a DFN (e.g., a DFN model).

Figure 7:
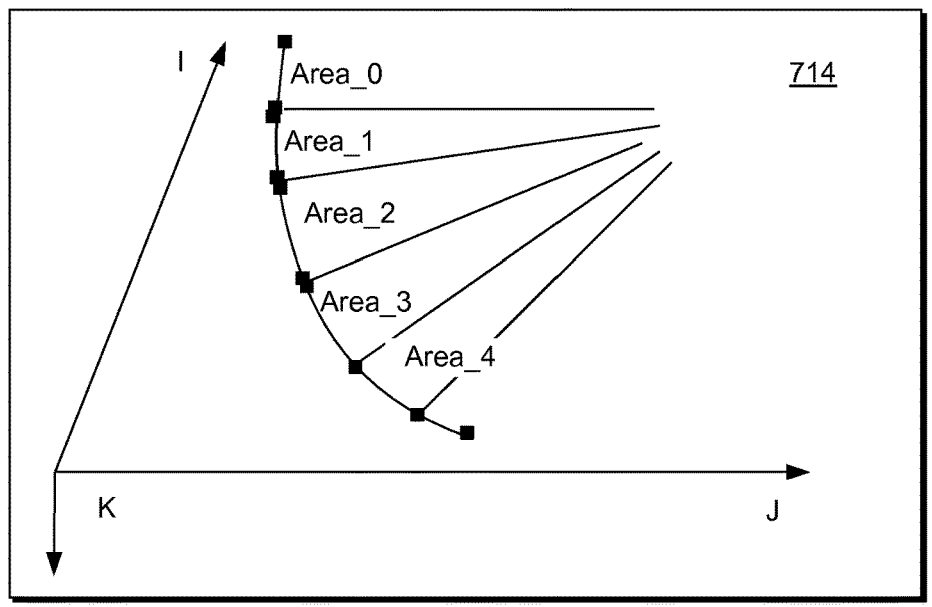
FIG. 7 illustrates an example of a method.
Figure 7:
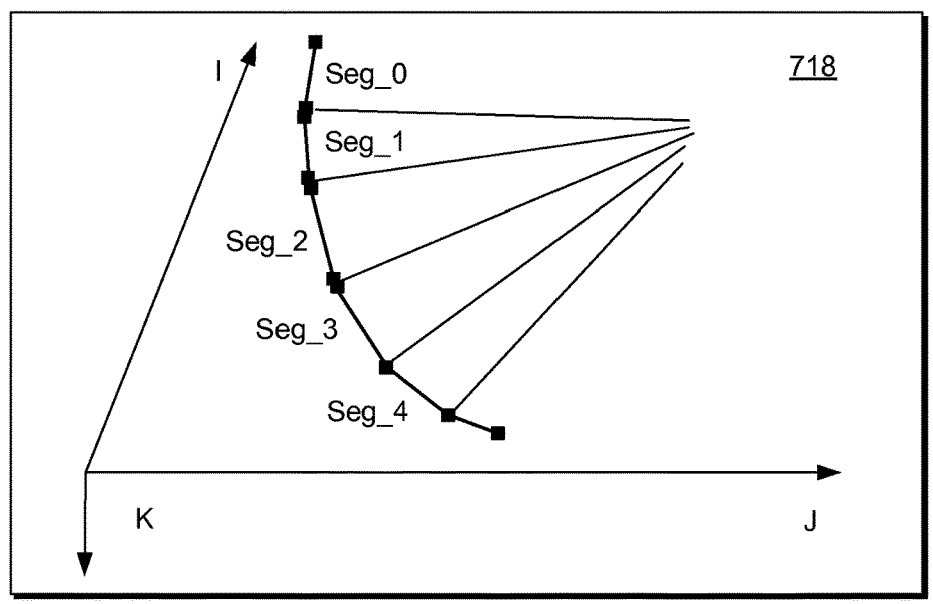
Figure 7:
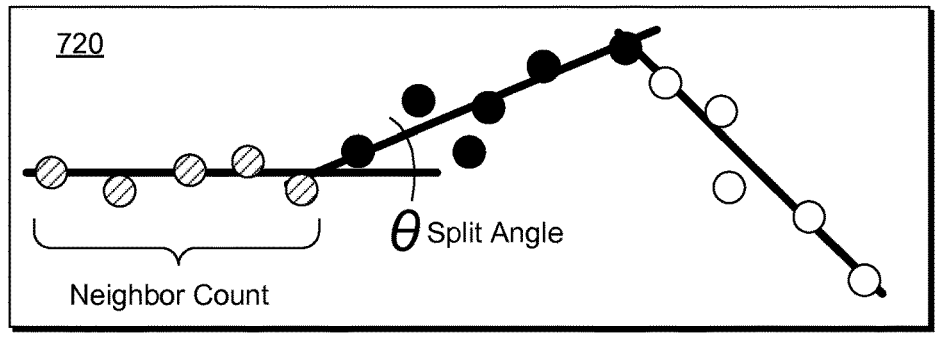

FIG. 7 shows an example of a method 710 that includes providing a surface in a plane (e.g., an I, J plane of an I, J, K coordinate or index system), which may be represented as a curve, and splitting the curve based on an angle criterion (see block 714). Splitting may include forming line segments, for example, as shown in a block 718. In such an example, the curve of the surface in the plane may be represented by segments where each of the segments includes end points.

As an example, splitting may occur in one or more other planes (e.g., of the I, J, K coordinate or index system). For example, splitting may include horizontal splitting and vertical splitting (e.g., splitting in an I, J plane and splitting in a plane that extends in the K coordinate direction). Where splitting occurs in multiple planes, as an example, the planes may be orthogonal. A result of splitting can be areas defined by points, lines, etc. (e.g., in a multidimensional space).

FIG. 7 also shows an example diagram 720 of three segments with points and a split angle (θ). As shown, a neighbor count may be a parameter or metric with respect to points that may be defined spatially with respect to information such as, for example, information of an SDP. As to a split angle, it may be defined with respect to lines that may be, for example, fit to points. As an example, a split angle may be defined with respect to a reference. For example, given a locus, a first line may define a first tangent to the locus and a second line may define a second tangent to the locus. In such an example, the first and second tangents may define an angle therebetween that can be compared to a split angle. In such an example, where the angle is less than the split angle, the first and the second lines may be considered part of a common line of an area; whereas, where the angle meets or exceeds the split angle, the first and the second lines may be considered to be part of two different areas (e.g., two adjacent areas).

As to selection of a curve, as the shape of intersection lines of a fracture and slices in depth may be structurally similar, a method may include selecting a longest slice to represent a shape of a fracture (e.g., from a top view as in the block 714 and 718). In such an example, each segment of the longest slice may be estimated by a best fit line segment $S_i$ which may be written in the form:

$$S_i: y = (\tan \alpha_i) x + b_i, x_i < x < x_{i+1}, i = 0, 1, 2 \quad (1)$$

In such an example, a split angle θ may be given (e.g., by a user, etc.) and the longest slice may be split into different line segments according to the equation:

$$|\alpha_i - \alpha_j| > \theta \quad (2)$$

In such an example, the fracture may be split into several areas (e.g., from a top view). As an example, each bisector plane denoted by $b_j$, which can be the border of a pair of two areas, may be stored.

As an example, where one or more vertical gaps exist between different parts of a mesh within a region, the mesh may be further split into several isolated meshes.

As an example, as part of a DFN conversion process, a method may commence with an area (e.g., Area_0) of a plurality of areas and process each area one-by-one. As an example, for Area_0, if meshes can be approximated by a single best fit plane $c_0$, then there may be an intersection line of $b_0$ and $c_0$, which may be called a connection line and be denoted by $con_i$. Otherwise, meshes within this area may be approximated respectively by their own best fit plane. As an example, after proxies of meshes in an area are determined, points on the boundary of each fracture mesh may be determined and input to a Graham scan algorithm to generate respective convex hulls. In such an example, each fracture mesh may be represented by a convex polygon $p_{i,j}$ on its own proxy.

As an example, prior to consideration of an Area i (i>0), if $con_0$ exists, a method may help to ensure that two points of a final convex polygon are on $con_0$. As an example, if meshes within an Area i can be approximated by a single best fit plane $c_i$, then an intersection line $con_i$ of $b_i$ and $c_i$ may be formed. For example, consider that two points may be found on $con_{i-1}$ and another two points may be found on $con_i$. With other boundary points, a convex hull may also be found using a Graham scan algorithm. In such an example, as the proxy convex polygons of the meshes on both sides of the bisector plane ($\{p_{i-1,j}\}$ and $\{p_{i,j}\}$) include points on the same connection line, split meshes may be connected through the connection lines (see, e.g., the processed data 650 of FIG. 6 and hulls 954 and 955 of FIG. 9). If meshes within an Area i are not approximated well by a single best fit plane, the meshes within this area may be approximated respectively by their own best fit plane. As an example, meshes in each area may be converted in such a manner.

As an example, after processing areas, a method may output a convex polygon set $\{p_{i,j}\}$, which may be used to form, at least in part, a DFN model. Such a model may be used for one or more purposes. For example, a simulator may receive a DFN model as input for purposes of simulation of fluid flow in one or more fractures of the DFN model (e.g., as may be represented by a patch or patches).

As an example, information received may include points. For example, an SDP may be specified according to a data structure that includes points (e.g., a list of points, which may be numbered, etc.). Such points may be defined in space, for example, using an appropriate coordinate system (e.g., Cartesian coordinate system, etc.). As an example, a method can include scanning one or more point lists horizontally and/or vertically to detect one or more split points. As shown in FIG. 7, points of a point list (e.g., of an SDP) may be at an approximate depth. During scanning through the point list, a method may employ a plurality of parameters, for example, consider a split angle parameter and a neighbor count parameters (see, e.g., the diagram 720 of FIG. 7). As an example, a split angle may optionally be a parameter that can be set and/or selected via a graphical user interface, a batch file, etc. As an example, a splitting process may determine that a split occurs when a change of trend is larger than an angle value as given by a split angle parameter. In such an example, points to either side of the split (e.g., a split location or split point) can be divided into two different areas. As an example, a neighbor count parameter value may be dependent on received information. For example, a neighbor count may depend at least in part on one or more characteristics of an SDP. As an example, in an SDP model that includes a plurality of SPD, neighbor count may differ for at least one of the SPDs. As an example, an algorithm may compute a neighbor count parameter value adaptively, which may, for example, depends on one or more of SDP size, standard deviation of SDP, etc.

Figure 8:
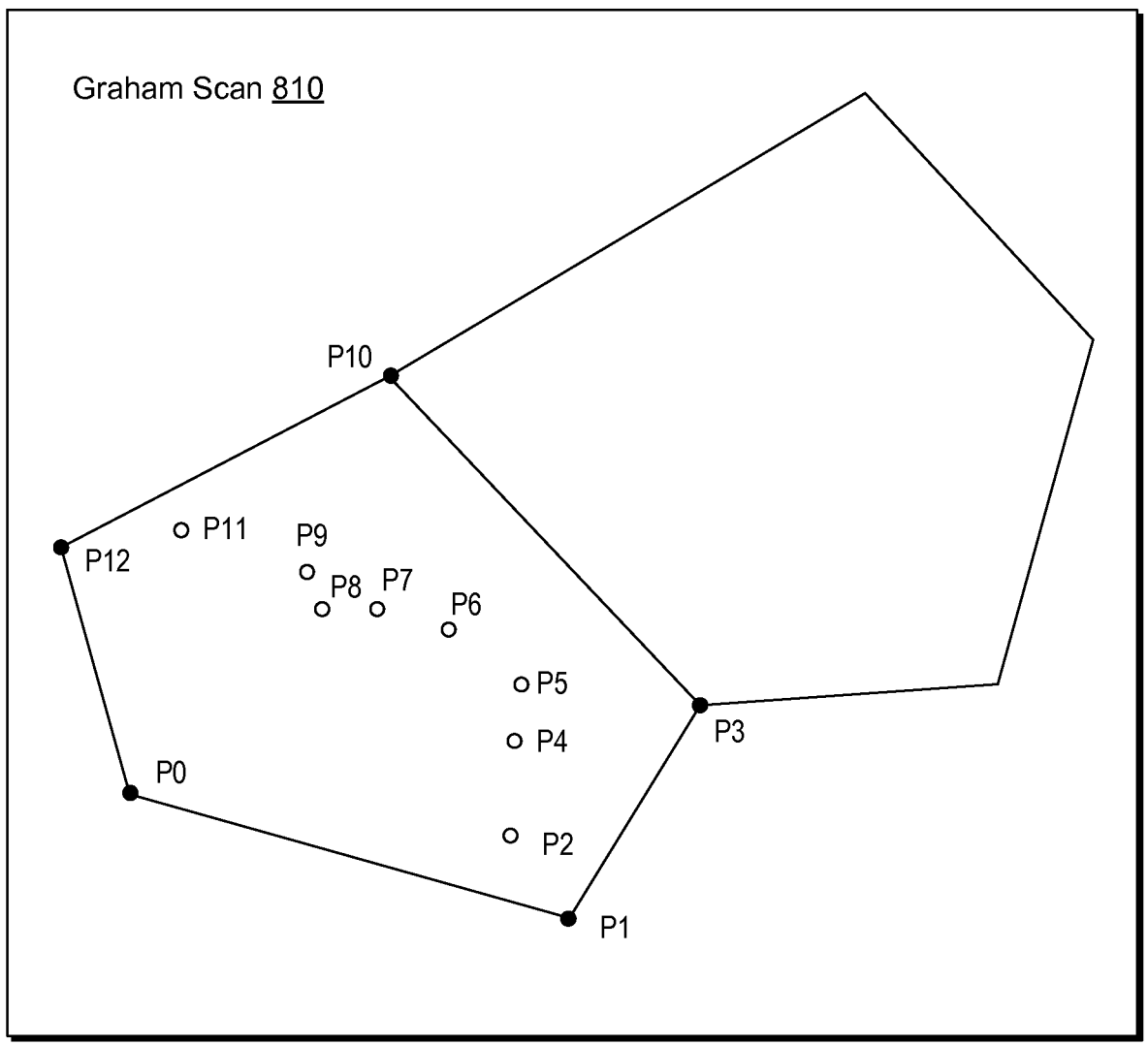
FIG. 8 illustrates an example of a Graham scan technique.

FIG. 8 shows a graphical illustration 810 that corresponds to a Graham scan technique, which may be employed to determine a convex hull, for example, given a set of points. In the example of FIG. 8, a set of points numbered from 0 to 12 are illustrated where of those points, the points 0, 1, 3, 10 and 12 can spatially define vertexes of a convex hull (e.g., a convex polygon). In the example of FIG. 8, the convex hull includes five vertexes and five sides (e.g., a pentagon), noting that other types of hulls may be determined for a give set of points.

As an example, a Graham scan technique may be used to find a convex hull for a finite point set on "2D" panel. As an example, a convex hull of a set of points S in n dimensions may be defined as the intersection of convex sets including S. As an example, a convex hull may be defined by properties. For example, consider the following: a convex hull is a convex polygon; a convex hull planar; and a convex hull includes projection points on a proxy (e.g., a proxy that corresponds to data such as SDP data, etc.).

As an example, one or more connectivity criteria may be employed with respect to an algorithm that can determine a convex hull. For example, a criterion may act to include those points of a previously determined convex hull (e.g., of a proxy or area) that are vertices on an intersection line with a current proxy (e.g. current area). In such an example, an algorithm may commence with those points as part of a set that defines, in part, a convex hull to be determined. As to a first proxy or area, such a criterion may not apply (e.g., unless an intersection line is provided, etc.). As an example, a method may employ a Graham scan technique where at least one point that defines a convex hull is predetermined based at least in part on a border of a convex hull that is to be adjacent to the convex hull that is to be determined. In such an example, at least some amount of connectivity between the existing convex hull and the "to be determined" convex hull may be assured. For example, in the illustration 810 of FIG. 8, the points P3 and P10 are points that are vertices of a pre-existing convex polygon.

Figure 9:
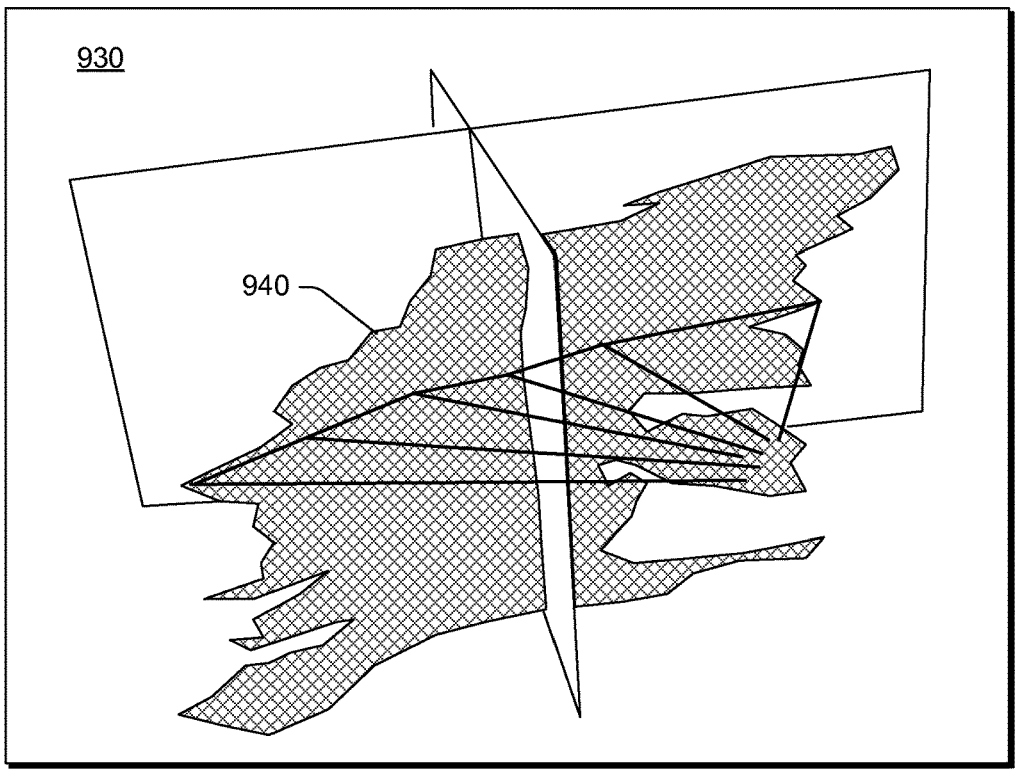
FIG. 9 illustrates an example of a method.
Figure 9:
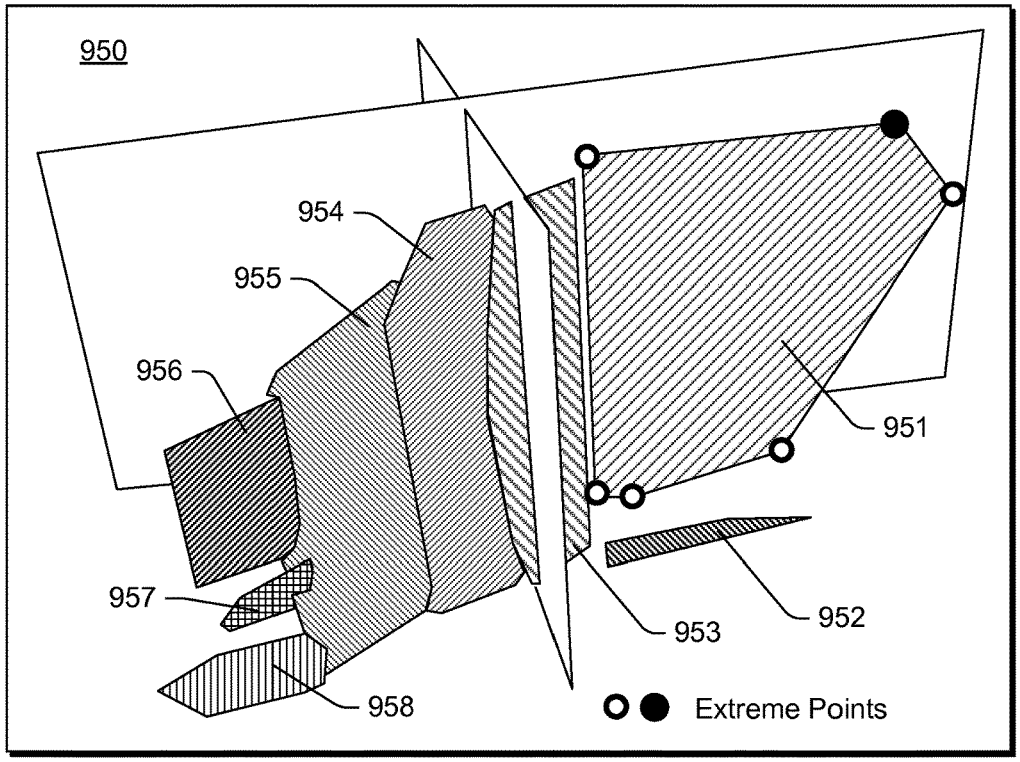

FIG. 9 shows a method 910 that includes a data block 930 and a processed data block 950. As shown in the data block 930, data may be processed, for example, at various depths (e.g., along a depth coordinate) using one or more angle criteria. Such an approach may split a structure into segments, for example, where each segment includes end points. In such an example, at each depth, segments may be generated via splitting of a line, curve, etc. of a structure in a plane (e.g., a horizontal plane). In the example of FIG. 9, areas may be formed (see, e.g., the block 714 of FIG. 7) and segments may be formed (see, e.g., the block 718 of FIG. 7).

As shown in the block 950 of FIG. 9, information generated in the block 930 may be used to determine extreme points, per a Graham scan or other type of algorithm that may find a convex hull. As shown, the surface indicated by the data of the block 930 may be split into eight convex hulls 951, 952, 953, 954, 955, 956, 957 and 958. Collectively, the eight convex hulls may be used to form a part of a DFN model. In such an example, the DFN model may honor one or more rules, for example, as to polygons.

Figure 10:
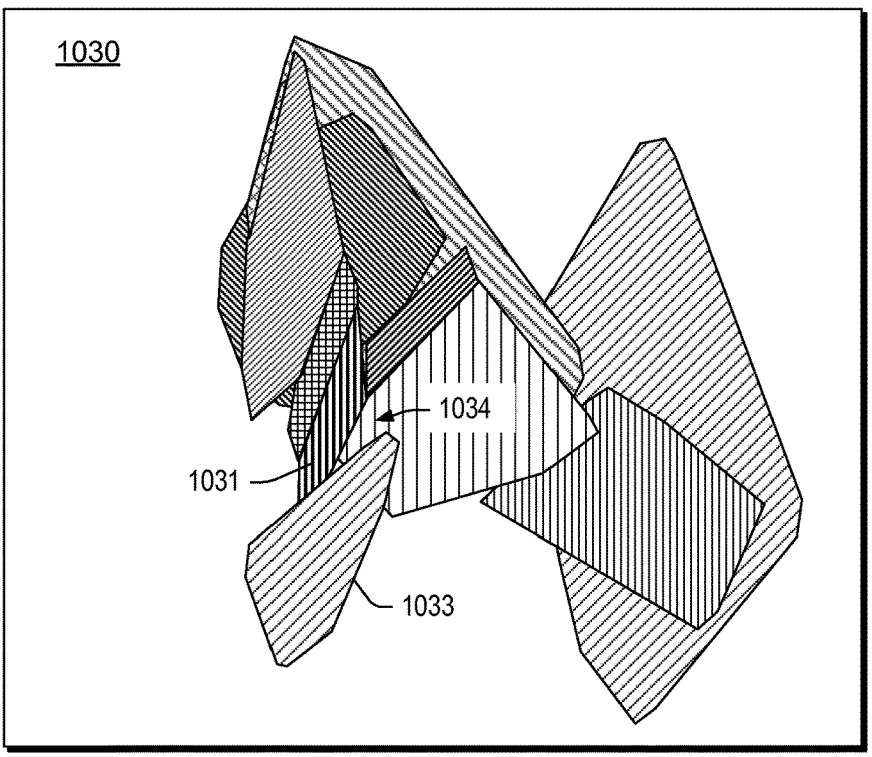
FIG. 10 shows an example of a set of polygons.
Figure 10:
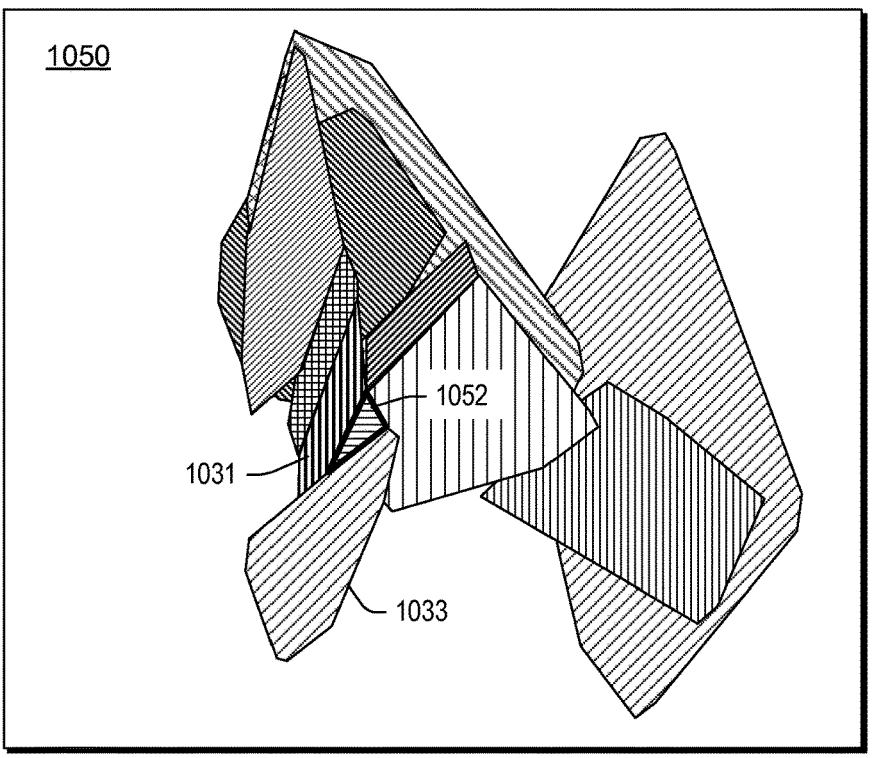

FIG. 10 shows an example of a set of polygons 1030 that includes a polygon 1031 and a polygon 1033 with a gap 1034 and a set of polygons 1050 that includes a polygon 1052 positioned at least in part in the gap 1032. In such an example, the polygon 1052 may be inserted to meet one or more connectivity criteria as to the polygon 1033 with respect to the polygon 1031. As mentioned with respect to the method 510 of FIG. 5, one or more fit criteria (e.g., which may include one or more connectivity criteria) may not be met, for example, where a proxy does not adequately "match" an area of a received data set (e.g., SDP data). In such an example, a gap may exist between two adjacent polygons (e.g., due to some amount of mismatch).

As an example, where a proxy does not fit an SDP well enough, a method may include discarding the proxy and determining, for example, a best fit plane. For example, in the set of polygons 1030, the polygon 1031 may be a proxy and the polygon 1033 may be a best fit plane. In such an example, the best fit plane as represented by the polygon 1033 does not adequately connect to the polygon 1031. For example, a connection line may not be shared between the polygon 1031 and the polygon 1033 (e.g., connectivity may be lost). As illustrated with respect to the set of polygons 1050, a polygon 1052 may be inserted between the polygon 1031 and the polygon 1033 such that connectivity exists. As an example, an inserted polygon may be a triangle with appropriate dimensions and orientation to provide for connectivity.

As an example, a criterion may be a normalized average distance of points to a proxy, which may be defined as a parameter "d". In such an example, a threshold value may be set where, for example, if d is greater than the threshold value, a method may consider a proxy fit inadequate. In such an example, a method may determine a best fit plane and use the best fit plane as an alternative to the proxy. As a best fit plane may not assure connectivity to a neighboring polygon, a method may include inserting one or more triangles as fill. As an example, a threshold value may be defined by a user, for example, via a graphical user interface, a batch file, etc. As an example, a threshold value may depend on one or more characteristics of a geologic formation, an SDP, an SDP model, a DFN, a portion of a DFN, etc.

Figure 11:
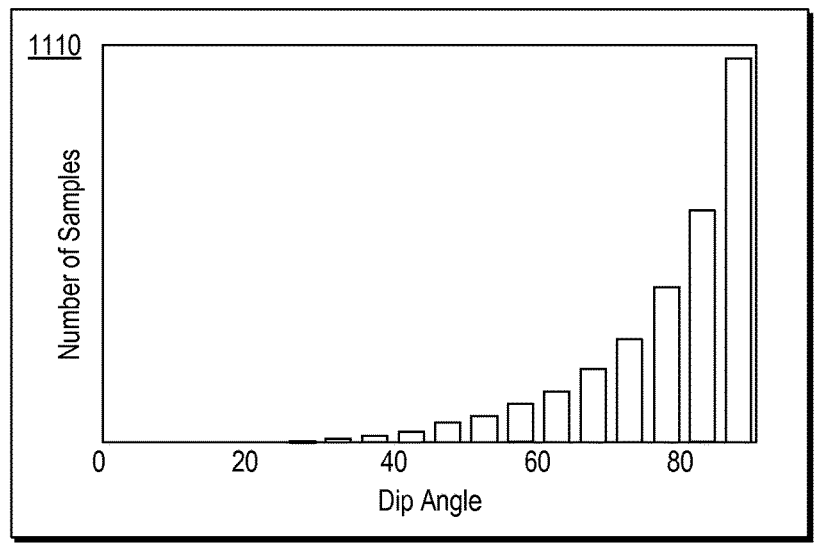
FIG. 11 illustrates examples of plots.
Figure 11:
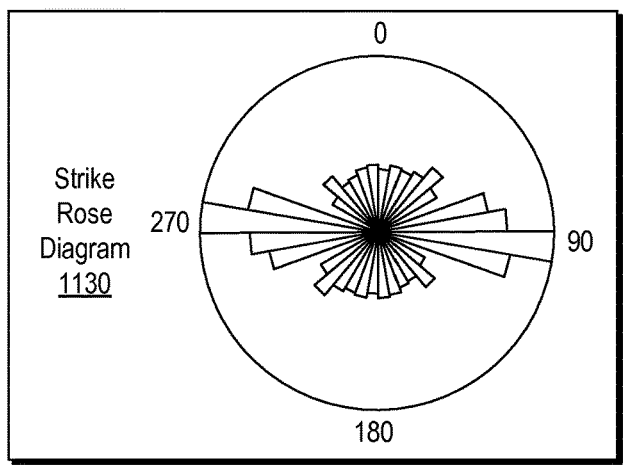
Figure 11:
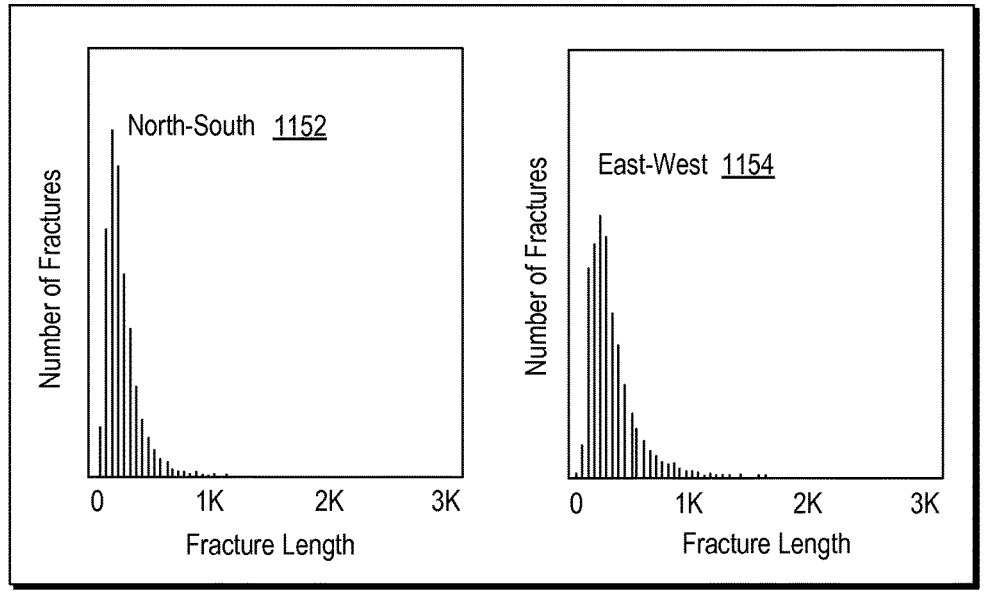

FIG. 11 shows a series of examples of plots 1110, 1130, 1152 and 1154. As an example, polygons may be analyzed, for example, to assess a subterranean region. For example, polygons generated via a method such as the method 410 of FIG. 4, the method 510 of FIG. 5, etc. may be analyzed as to dip angle. For example, the plot 1110 shows number of samples (e.g., number of polygons) with respect to dip angle. As shown, a distribution exists where the number of samples generally increases as dip angle approaches 90 degrees.

As an example, polygons may be analyzed with respect to strike and, for example, plotted via a rose diagram. In FIG. 11, the plot 1130 shows strike information for over 40,000 samples where, as may be ascertained via the plot 1110, a large portion of the samples run across the rose diagram plot 1130 from about 90 degrees to about 270 degrees.

The plots 1152 and 1154 of FIG. 11 correspond to fractures extending approximately north-south and fractures extending approximately east-west, respectively. As shown, the north-south fractures tend to be shorter in length than the east-west fractures.

As an example, a method can include performing one or more statistical analyses based at least in part on polygon data (e.g., convex hull data). As an example, statistics may be computed for one or more of fracture dip, orientation and fracture length. As illustrated in FIG. 11, the fractures may be classified as being high angle with a portion having an approximately east-west orientation. As an example, a method may compute a statistical distribution for fractures based at least in part on polygons, which may uncover additional information such as existence of a portion of alternatively directed fractures. For example, while observations from the field may indicate approximately east-west fractures, a statistical analysis may uncover an anticline or other features. For example, an anticline may be indicated by a portion of approximately north-south fractures, which may be smaller in scale than the approximate east-west fractures (see, e.g., the plots 1152 and 1154).

Figure 12:
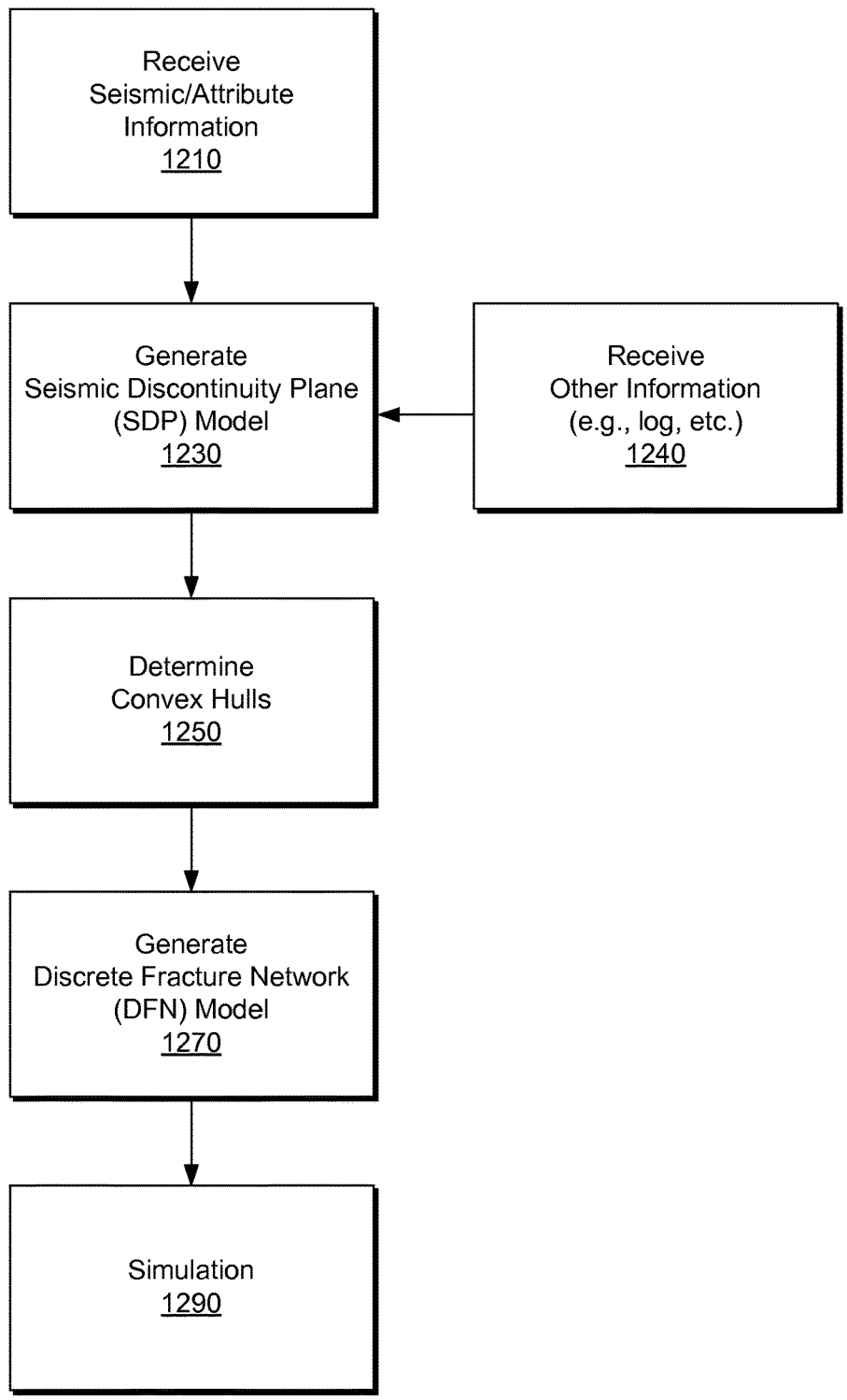
FIG. 12 illustrates an example of a method.

FIG. 12 shows an example of a method 1200 that includes a reception block 1210 for receiving seismic and/or attribute information and a generation block 1230 for generating a seismic discontinuity plane (SDP) model. In such an example, the method 1200 may optionally include a reception block 1240 for receiving one or more other types of information such as, for example, log information, which may be used, at least in part, by the generation block 1230 for generating the SDP model.

As shown in the example of FIG. 12, the method 1200 includes a determination block 1250 for determining convex hulls based at least in part on the SDP model. For example, an SDP model may include points in space where such points may be analyzed to determine convex hulls. For example, consider the method 410 of FIG. 4, which is illustrated along with approximate graphical representations of points in space. As an example, the determination block 1250 may include filling, for example, filling one or more regions between convex hulls with one or more polygons to help to assure connectivity where adjacent convex hulls, where appropriate.

The method 1200 also includes a generation block 1270 for generating a discrete fracture network (DFN) model based at least in part on a portion of the convex hulls (e.g., an optionally fill, if present). In such an example, the DFN model may be input to a simulator, for example, per a simulation block 1290, for simulating physical phenomena in a geologic environment. As an example, such a simulator may be a reservoir simulator that can solve for pressure values, saturation values, etc., which may indicate how one or more fluids flow in the geologic environment.

As an example, a method may include determining a dip for a subterranean structure. As an example, a subterranean structure may be a fault, faults, a fracture, fractures or other structure. As an example, a structure may be or include a fracture network (e.g., fractures that include intersections).

As an example, dip may be defined as the magnitude of the inclination of a plane from horizontal. As an example, true, or maximum, dip may be measured perpendicular to a strike. As an example, apparent dip may be measured in a direction other than perpendicular to a strike. As an example, dip may be defined as an angle between a planar feature, such as a sedimentary bed, a fault, a fracture, etc. and a plane (e.g., a horizontal plane).

As an example, dip (e.g., dip information) may facilitate analysis of a subterranean formation. For example, dip information may facilitate fault and/or fracture analysis. Where a structure may be represented as a planar surface, dip may be based on the angle of that planar surface with respect to another surface (e.g., a horizontal surface).

As an example, where a structure includes a curve or one or more curved portion (e.g., or other shapes, etc.), dip determination may be more challenging. As an example, consider a reservoir classified as an unconventional reservoir. In such an example, a seismic survey or surveys may be conducted that acquire seismic data (e.g., seismic signals that may be represented as values in a seismic data set). In such an example, shapes of surfaces extracted from seismic data that may represent fractures may be more complex than, for example, a single planar surface.

As an example, an analysis may include plotting information on a rose diagram (see, e.g., the rose diagram plot 1130 of FIG. 11). For example, a rose diagram may illustrate one or more fracture strike orientations and may visually indicate that more than one fracture set may exist. As an example, a rose diagram may illustrate dip information (e.g., consider dip azimuth directions; noting that various relationships may exist between strike information and dip information).

As an example, a method may include determining dip of a complex fracture in a manner that may reduce influence of data that may lead to low dip estimates. For example, a fracture may be expected to have a dip value that is relatively high. For example, a fracture may be expected to have an angle that is not close to zero (e.g., where zero represents a horizontal plane).

As an example, a method may include determining a dip for a complex surface based in part on an average unit normal vector in a local triangular mesh that represents the complex surface (e.g., or a portion of the complex surface). For example, such a method may include triangulation of the complex surface. As an example, a triangulation process may be a tessellation process that includes using triangles that may differ in shape to fill a region (e.g., a surface). In such an example, the unit normal vector of each triangle in the triangular mesh may be computed. As an example, the unit normal vectors may be summed, for example, using areas of each of the triangles as weights. A method may then determine a dip based on an average unit normal vector (e.g., the dip of the complex surface may be estimated from the average unit normal).

As an example, a tessellation process may include using one or more types of polygons. In such an example, each of the polygons may include associated information from which a unit normal and an area may be determined. In such an example, areas may be applied as weights for normal in a process that may determine an average normal (e.g., an average unit normal).

As an example, a method that employs tessellation for polygon filling of a surface together with normal and area computation may be robust with respect to variations that may exist in the surface. For example, such an approach may be robust where some portions may differ from a suitable, realistic dip for the surface.

Figure 13:
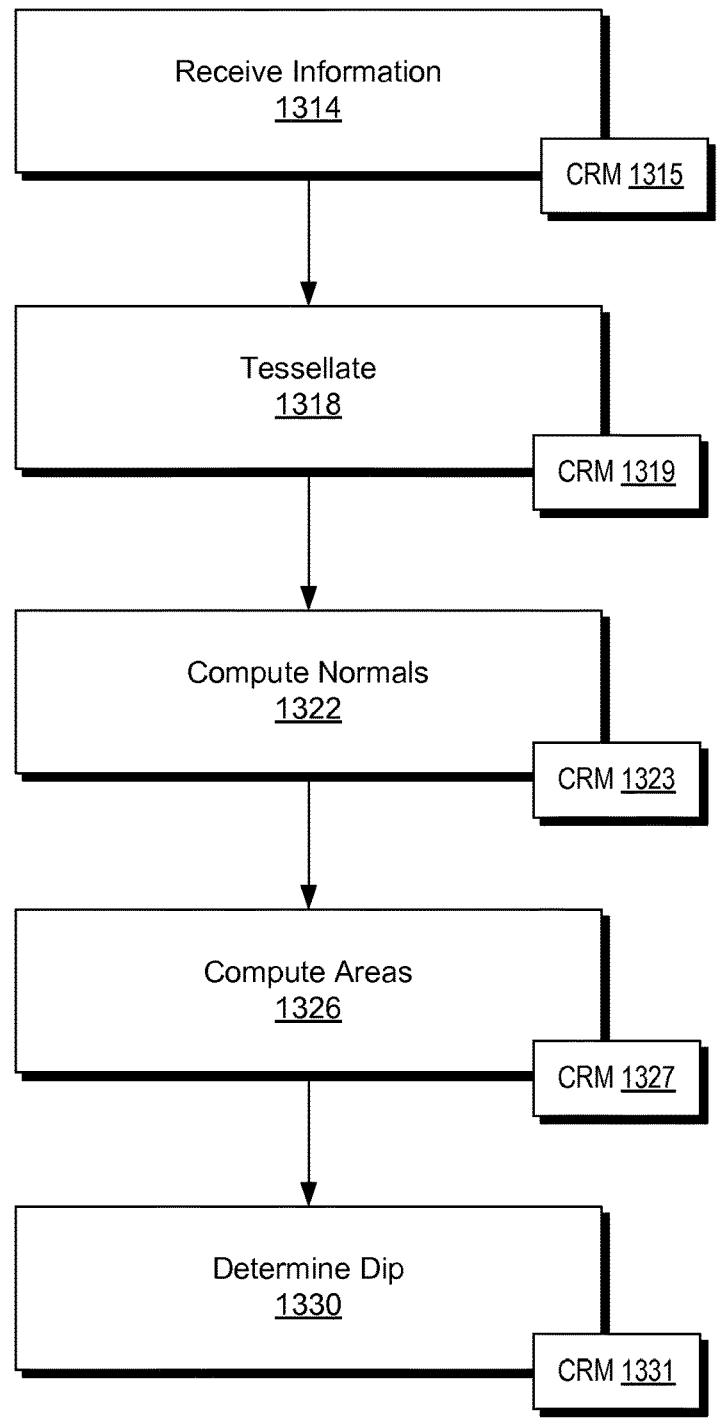
FIG. 13 illustrates an example of a method.

FIG. 13 shows an example of a method 1310 that includes a reception block 1314 for receiving information that defines a three-dimensional subterranean structure; a tessellation block 1318 for tessellating the subterranean structure into triangles (e.g., based at least in part on the provided information); a computation block 1322 for computing a normal for each of the triangles; a computation block 1326 for computing an area for each of the triangles; and a determination block 1330 for determining a dip for the subterranean structure based on the normals and the areas of the triangles. As an example, such a method may include simulating phenomena associated with a subterranean formation based at least in part on the dip.

The method 1310 is shown in FIG. 13 in association with various computer-readable medium (CRM) blocks 1315, 1319, 1323, 1327 and 1331. Such blocks generally include instructions suitable for execution by one or more processors (or processor cores) to instruct a computing device or system to perform one or more actions. While various blocks are shown, a single medium may be configured with instructions to allow for, at least in part, performance of various actions of the method 1310. As an example, a computer-readable medium (CRM) may be a computer-readable storage medium.

As an example, the method 1310, or a portion thereof, may be optionally implemented as a plug-in to a framework. For example, consider a plug-in to the OCEAN® framework that can determine dip information (e.g., per the determination block 1330 of FIG. 13).

As an example, a method such as the method 1310 of FIG. 13 may be performed as part of a workflow that may include at least a portion of a method such as the method 310 of FIG. 3. For example, where tessellation is performed per the tessellation block 1316, tessellated shapes (e.g., polygons) may be analyzed via a partitioning process and/or a splitting process (see, e.g., the split block 318 of the method 310 of FIG. 3). For example, a plurality of tessellated shapes may be combined to define an area, which may be processed to define a proxy. As an example, information from a method such as the method 310 of FIG. 3 and information from a method such as the method 1310 of FIG. 13 may be analyzed. For example, consider the plots 1110, 1130, 1152 and 1154 of FIG. 11. In particular, consider the plot 1110, which shows number of samples versus dip angle. As an example, convex hulls may be analyzed as to dip angle and tessellated polygons may be analyzed as to dip angle. As an example, orientations may be plotted for convex hulls and/or tessellated polygons, for example, using a rose diagram (see, e.g., the rose diagram 1130 of FIG. 11).

As an example, a method may include performing a workflow where the workflow includes triangulation of a complex surface; computation of the unit normal of each triangle; computation of the area of each triangle; summing the unit normal with the areas as the weights; calculating the dip of a plane that is perpendicular to the weighted average normal; and using the calculated dip in a subsequent process (e.g., plotting a rose diagram, simulating phenomena, etc.).

As an example, a complex surface may be organized as several point lists, for example, at different depths. In such an example, a method may include looping over the points in two adjacent point lists to form triangles where, after performing such an operation to various adjacent point lists for the complex surface, the triangulation of the complex surface may be completed.

As an example, a method may include computing a normal (e.g., a unit normal) for individual triangles in a triangular mesh. As an example, given a triangle, two of its edges may be denoted by $\vec{e}_1$ and $\vec{e}_2$ and the normal $\vec{n}$ of the triangle may be determined, for example, using the cross product of $\vec{e}_1$ and $\vec{e}_2$:

$$\vec{n} = \vec{e}_1 \times \vec{e}_2 \tag{1}$$

In such an example, the normal may be normalized to be a unit vector. In such an example, the unit normal vector may have a direction that may, for example, be defined with respect to a coordinate system.

As an example, a method may include computing the area of individual triangles in a triangular mesh. For example, given three vertices of a triangle, the length of its edges may be determined, which may be denoted by a, b and c. In such an example, Heron's formula may be used to compute the area S of the triangle:

$$S = \sqrt{p(p-a)(p-b)(p-c)}, \text{ where } p=(a+b+c)/2 \tag{2}$$

In the foregoing formula, p may be referred to as the semiperimeter. As an example, the area of a triangle may be computed as the product of its inradius (radius of an inscribed circle) and its semiperimeter. As an example, depending on angles of a triangle, an equation may include ordering the lengths a, b and c and using a formula that includes terms based these values as ordered (e.g., a formula that may add numerical stability where small internal angles may exist). As an example, various formulas such as Brahmagupta's formula, Bretschneider's formula, etc. may be applied (e.g., optionally depending on tessellation shapes, etc.).

As an example, a method may include using individual areas of triangles in a triangular mesh as weights, for example, when summing to arrive at a unit normal (e.g., unit normal vector) for a region.

As an example, a method may include summing with weights. For example, assume areas $\{S_i\}$ for triangles of a triangular mesh and corresponding unit normal vectors $\{\vec{n}_i\}$, in such an example, the following formula may be used to determine a final vector $\vec{d}$, which may represent the orientation of a complex surface:

$$\vec{d} = \sum_i (S_i \vec{n}_i) \Big/ \sum_i S_i \tag{3}$$

In such an example, the dip of the complex surface may be estimated using $\vec{d}$. As an example, the dip may be used in one or more subsequent processes, for example, rose diagram plotting, simulation, etc.

Figure 14:
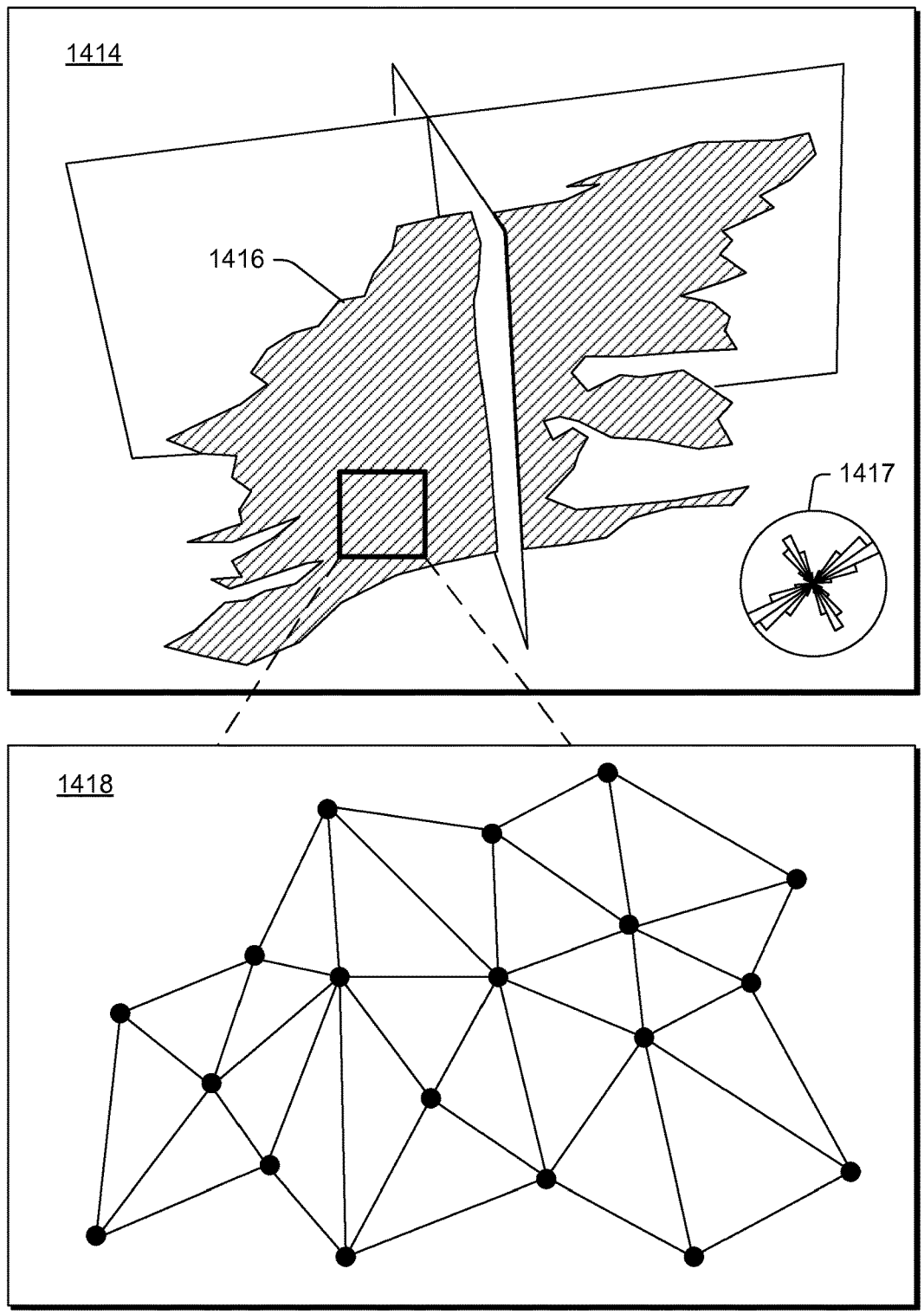
FIG. 14 illustrates an example of a method.

FIG. 14 shows an example of a method 1410 that includes providing data, for example, as shown in a block 1414. Such data may include data that represents a surface 1416 where the surface may include an orientation or orientations, for example, that may be expressed with respect to a rose diagram 1417 (see also, e.g., the rose diagram plot 1130 of FIG. 11). As an example, the method 1410 may include tessellating at least a portion of the surface 1416, for example, using triangles that may vary in shape (e.g., with respect to a coordinate system).

Figure 15:
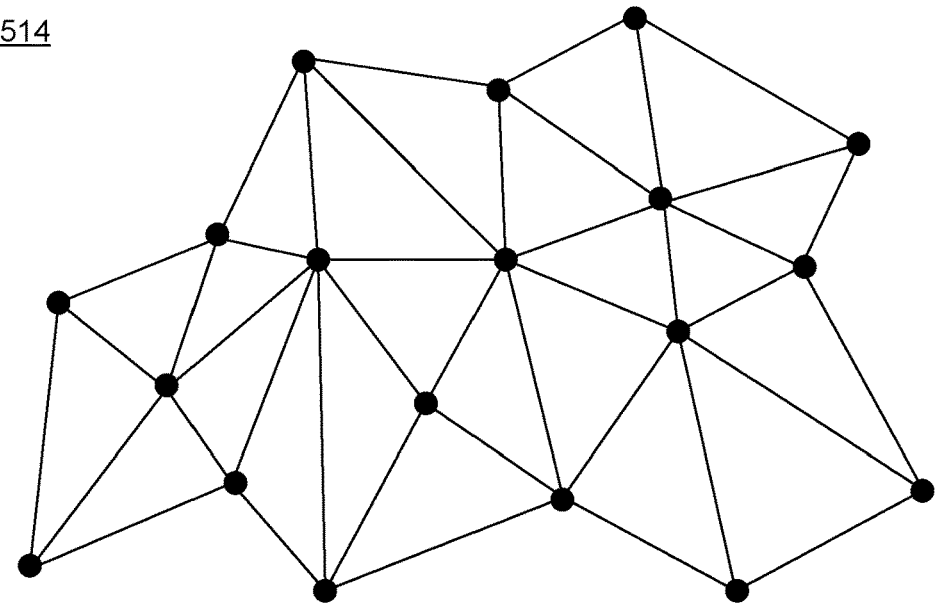
FIG. 15 illustrates an example of a method.
Figure 15:
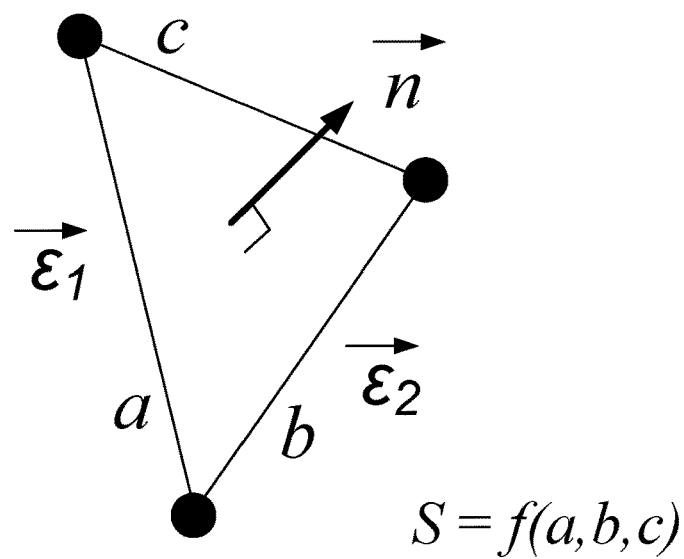

FIG. 15 shows an example of a method 1510 that includes providing data, for example, as shown in a block 1514. Such data may include coordinates of vertices, for example, vertices that can define triangles. In such an example, the method 1510 may include computing values for individual triangles. For example, as shown in a block 1518, the method 1510 may include computing a normal and computing an area.

Figure 16:
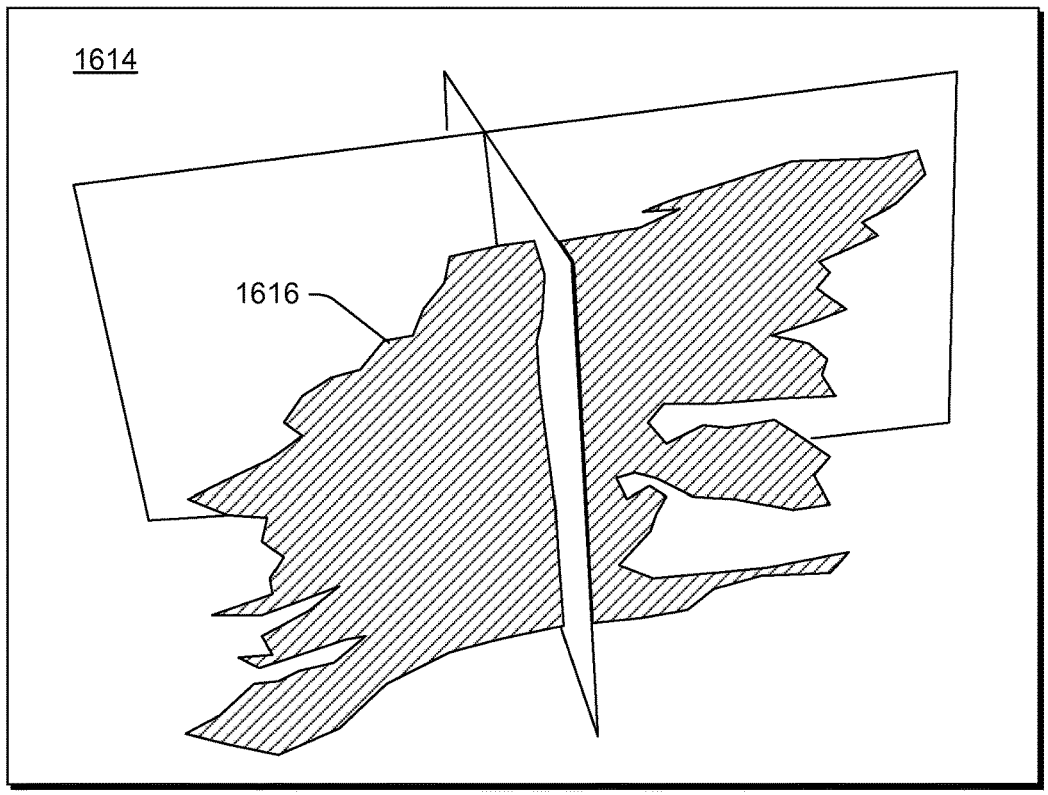
FIG. 16 illustrates an example of a method.
Figure 16:
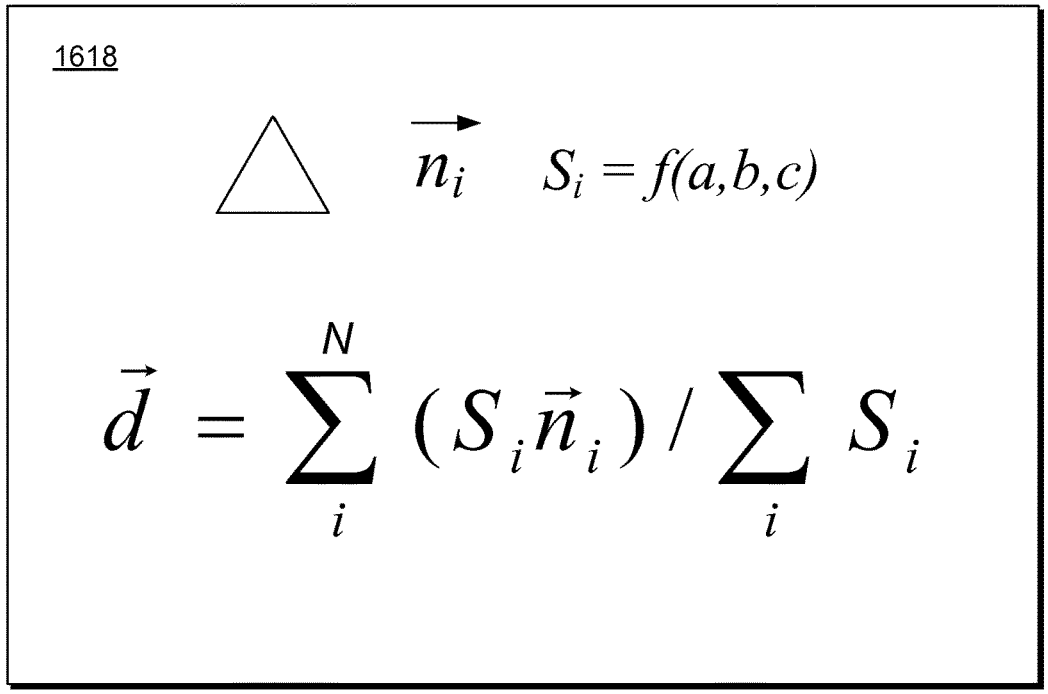

FIG. 16 shows an example of a method 1610 that includes receiving data, for example, as shown in a block 1614 (see also, e.g., the data 630 of FIG. 6). Such data may include data that represents a surface 1616 in a three-dimensional space. As an example, the surface 1616 may be tessellated to form a mesh, for example, a collection of nodes or vertices that may define polygons such as triangles. In such an example, as shown in a block 1618, for individual polygons, the method 1610 may include computing normals and area and determining an overall normal for a region represented by the individual polygons. For example, where the polygons are triangles, a number of triangles from 1 to N may be considered where a normal and an area are computed, which, in turn, are used to determine an overall normal for a region represented by the triangles. In such an example, the overall normal may be an average unit normal determined using a weighted sum of individual unit normals, for example, where the weights are areas corresponding to the individual unit normals.

Figure 17:
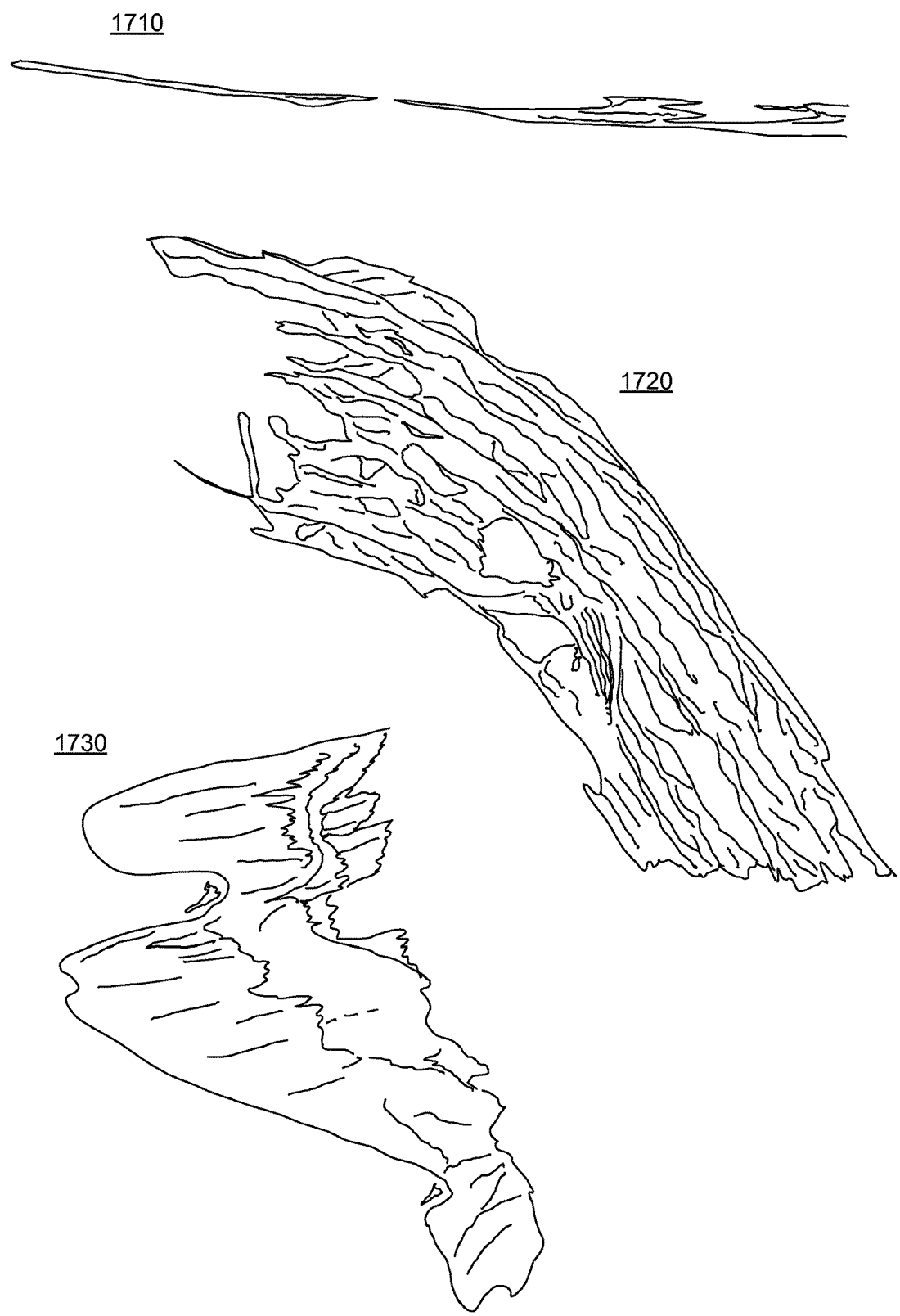
FIG. 17 illustrates examples of structures.

FIG. 17 shows three examples of structures represented as surfaces 1710, 1720 and 1730. For example, the surface 1710 may be a thin and long surface, the surface 1720 may be a curved surface and the surface 1730 may be a zigzag surface. As an example, the surfaces 1710, 1720 and 1730 may be complex surfaces that represent fractures.

As an example, a method such as the method 1310 of FIG. 13 may be applied to one or more of such surfaces, for example, to determine one or more corresponding dip values. As an example, such an approach may provide a dip or dip values representative of a fracture, a fault, etc. As an example, an approach that uses a best fit plane to fit the surface 1710 may be suboptimal as the surface is thin and long and may result in a vertical plane rather than a horizontal plane. As an example, an approach may be suboptimal for the surface 1730 as dips of most of the points of the zigzag surface 1730 tend to be approximately 45 degrees such that an average may not result in a high dip value as a user may expect. As an example, a method such as the method 1310 of FIG. 13 may be applied to one or more of the surfaces 1710, 1720 and 1730 and provide corresponding dips that may be more meaningful geologically (e.g., representative of the structures giving rise to the surfaces).

As an example, a method may include receiving information in the form of a model (e.g., model information). As an example, a model may be a seismic discontinuity plane model (e.g., an "SDP" model), which may be derived from seismic data (e.g., raw data, one or more attributes, etc.). As an example, a method may include using a seismic discontinuity planes (SDP) model for dip calculation. As an example, a method may be used for the dip calculation of a point set in 3D space. As an example, a method may be implemented where complex fracture surfaces may be represented, for example, by point sets.

As an example, a system may include one or more modules, which may be provided to analyze data, control a process, perform a task, perform a workstep, perform a workflow, etc.

As an example, a method can include receiving information that defines a three-dimensional subterranean structure; tessellating the subterranean structure into triangles; computing a normal for each of the triangles; computing an area for each of the triangles; and determining a dip for the subterranean structure based on the normals and the areas of the triangles. As an example, such a method may include simulating phenomena associated with a subterranean formation based at least in part on the dip.

As an example, a subterranean structure may be or include a fracture. As an example, a fracture may include an aspect ratio that differs from unity by at least one order of magnitude (e.g., 10 or 0.1). As an example, a fracture may be or include a curved fracture. As an example, a fracture may be or include a zigzag fracture.

As an example, a method may include computing a normal by computing a cross product of two vectors. As an example, a method may include computing an area by applying Heron's formula.

As an example, a method may include determining a dip by computing a weighted sum of the normals. In such an example, a method may include using areas as weights to weight corresponding normals. As an example, a method may include normalizing a normal (e.g., normalizing normals).

As an example, a method may include plotting a rose diagram based at least in part on a determined dip.

As an example, computing an area may include computing a semiperimeter, computing an inradius or computing one or more other parameters.

As an example, a system may include a processor; memory operatively coupled to the processor; one or more modules stored in the memory and including processor executable instructions to instruct the system to: receive information that defines a three-dimensional subterranean structure; tessellate the subterranean structure into triangles; compute a normal for each of the triangles; compute an area for each of the triangles; and determine a dip for the subterranean structure based on the normals and the areas of the triangles. As an example, such a system may include instructions to simulate phenomena associated with a subterranean formation based at least in part on a model that includes the dip. As an example, a system may include instructions to determine a dip by computing a weighted sum of normals (e.g., using areas as weights).

As an example, one or more computer-readable storage media may include processor-executable instructions to instruct a computer to: receive information that defines a three-dimensional subterranean structure; tessellate the subterranean structure into triangles; compute a normal for each of the triangles; compute an area for each of the triangles; and determine a dip for the subterranean structure based on the normals and the areas of the triangles.

As an example, one or more computer-readable storage media may include processor-executable instructions to instruct a computer to simulate phenomena associated with a subterranean formation based at least in part on a model that includes a determined dip.

As an example, one or more computer-readable storage media may include processor-executable instructions to instruct a computer to compute a weighted sum of normals (e.g., using areas as weights).

Figure 18:
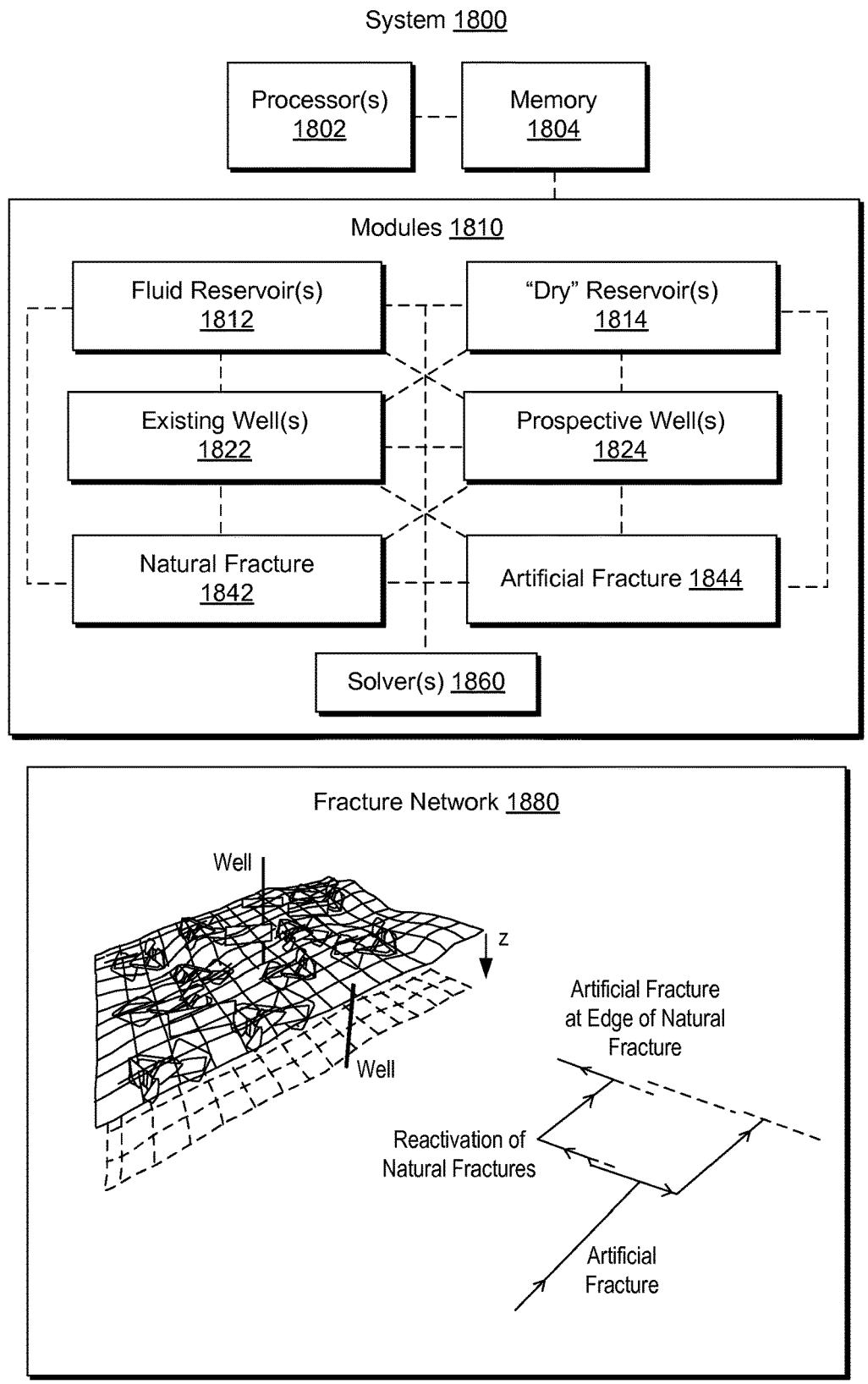
FIG. 18 illustrates an example of a system, examples of modules and an example of a fracture network.

FIG. 18 shows an example of a system 1800, examples of various modules 1810 and an example of an approximate illustration of a fracture network 1880 (e.g., as part of a DFN model, etc.). In the example of FIG. 18, the system 1800 includes one or more processors 1802 operatively coupled to memory 1804. As an example, the memory 1804 may store modules such as one or more of the modules 1810, which may provide for modeling storage, flow, etc., in a subterranean environment. In the example of FIG. 18, the modules 1810 include a fluid reservoir module 1812, a dry reservoir module 1814, a module for existing wells 1822, a module for prospective wells 1824, a natural fracture module 1842, an artificial fracture module 1844 and one or more solver modules 1860. In the example of FIG. 18, the modules 1810 may include instructions suitable for execution by one or more of the processors (e.g., processor cores) to instruct a computing device or system to perform one or more actions. For example, the system 1800 may be instructed by instructions of one or more of the modules 1810.

As an example, a method can include implementing one or more of the modules 1810 to represent a network such as the fracture network 1880. In the example of FIG. 18, the fracture network 1880 may include natural fractures and artificial fractures. As an example, creation of a hydraulic fracture may be impacted by one or more natural fractures. For example, hydraulic fracture growth may proceed in a northeast-southwest direction that reactivates natural fractures (dashed lines) trending in another direction or directions (see, e.g., arrows indicate possible propagation directions of hydraulic fractures).

As an example, a method can include modeling of natural fractures in an environment using a model and simulating behavior of the environment using the model (e.g., for storage, flow, etc.), for example, with respect to a reservoir or reservoirs. In turn, a solution may be analyzed for prospective artificial fractures. Such an analysis may, for example, include positioning of one or more wells for creating one or more prospective artificial fractures with respect to one or more natural fractures to generate a network that acts to reactivate natural fractures as conduits for flow of fluid. As an example, such an analysis may aim to avoid certain natural fractures and reactivate (e.g., utilize) other natural fractures. In such an example, refinement of natural fracture locations, properties, etc., may occur using a model (e.g., a DFN model, etc.), optionally in conjunction with a 3D grid model that models one or more reservoirs.

As an example, a model may account for stress or one or more other factors that may relate to fracturing. As an example, a natural fracture model may be mathematically linked to a stress model for a 3D environment. As an example, a model may account for a chemical process (e.g., acidizing). As an example, a natural fracture model may be mathematically linked to a chemical reaction model for modeling a chemical process (e.g., with respect to one or more fracture characteristics). Where history matching is performed for flow based at least in part on a solution to a natural fracture model, refinements to the natural fracture model may act to update one or more parameters associated with stress (e.g., direction, etc.).

As an example, a system can include one or more processors for processing information, memory operatively coupled to the one or more processors and modules that include instructions storable in the memory and executable by at least one of the one or more processors. Such modules may include a reservoir module for modeling a reservoir in a subterranean three-dimensional environment via a three-dimensional grid model, a natural fracture module for modeling a natural fracture via a model (e.g., a DFN), a well module for modeling a well via a well model, and one or more solver modules for solving for values of fluid flow in a fracture network based at least in part on modeling a natural fracture via a model. As an example, a system may include an artificial fracture module for modeling an artificial fracture via a model. As an example, a system may include a solver module for solving for values of fluid flow in a fracture network that includes at least one natural fracture and at least one artificial fracture.

Figure 19:
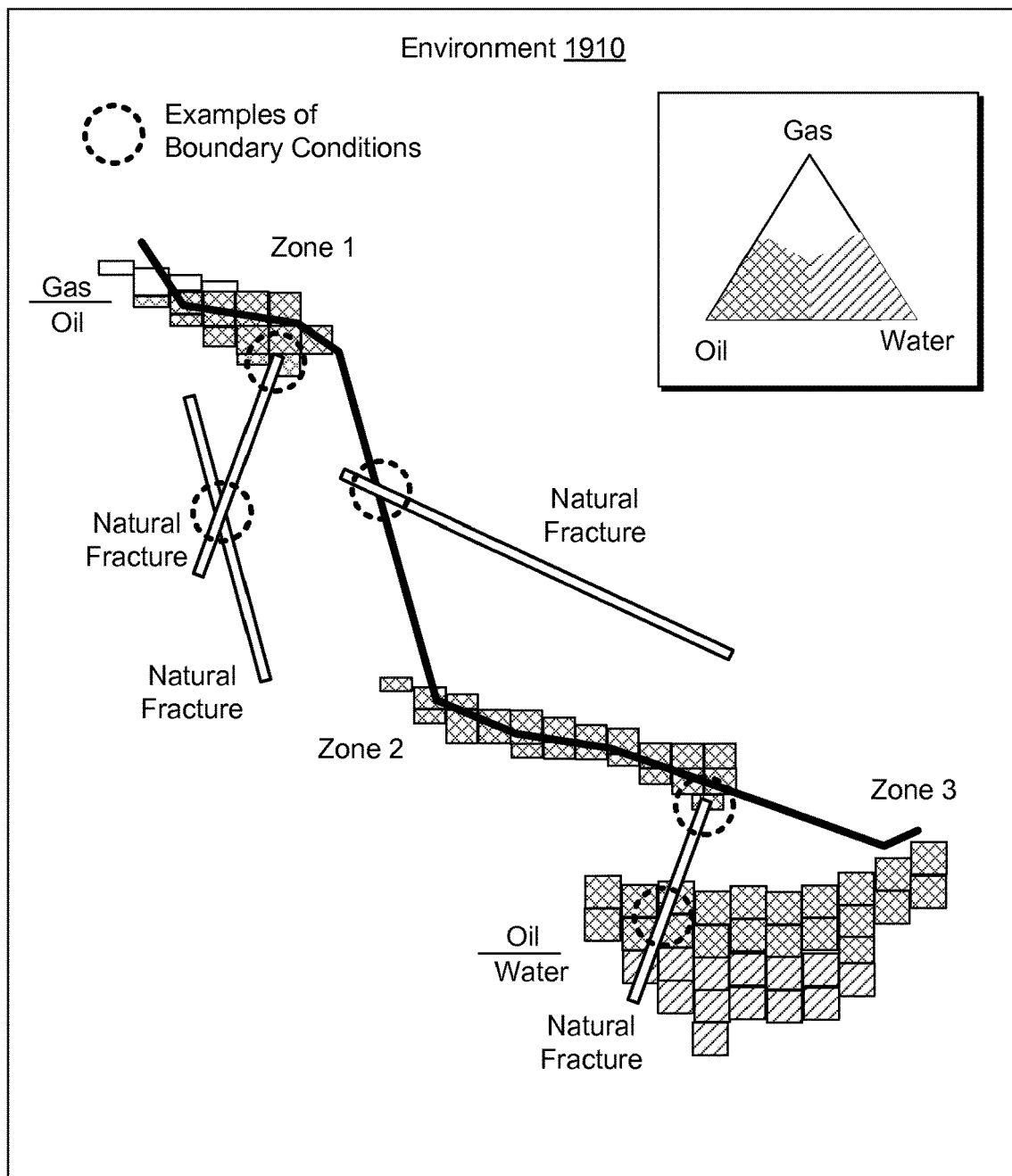
FIG. 19 illustrates an example of an environment.

As mentioned, boundary conditions may be defined (e.g., imposed) on one or more portions of a model that models a natural fracture, natural fractures, etc. FIG. 19 shows an example of an environment 1910 that includes various formations, a wellbore and natural fractures. As indicated, the formations include fluid such as oil, gas and/or water, which may define various zones. As to boundary conditions, a natural fracture may include a natural fracture to natural fracture boundary condition, a natural fracture to oil filled formation boundary condition, a natural fracture to wellbore boundary condition, a natural fracture to a gas-filled formation boundary condition, a natural fracture to a water filled formation boundary condition, etc. As an example, a natural fracture may include multiple boundary conditions, for example, for both a wellbore and a fluid filled formation.

As an example, a formation may be considered fluid filled or void (e.g., "dry") depending on type of fluid. For example, a gas filled formation may be considered void with respect oil where a goal is to produce oil. As indicated by the example environment 1910 of FIG. 19, oil and water may coexist within a formation and a strategy may be formulated to produce oil with minimal water content. As an example, such a strategy may be honed via use of a model that models one or more natural fractures with respect to an environment (e.g., to avoid activation of a natural fracture that may lead to increase of water content in oil).

As an example, a method can include receiving information that defines a three-dimensional subterranean structure; splitting the subterranean structure (e.g., a fracture, fractures, a fault, faults, etc.) into portions; generating convex hulls for the portions; and generating a discrete fracture network based at least in part on the convex hulls. Such a method may further include simulating phenomena associated with a subterranean formation based at least in part on a model that includes the discrete fracture network.

As an example, a method can include tessellating at least a portion of a subterranean structure into polygons; computing a normal for each of the polygons; and determining one or more dip values based on the normals of the polygons. In such an example, the polygons may be triangles and the method may also include computing areas for each of the triangles. As an example, a method may include determining a dip (e.g., a dip value) for a subterranean structure based at least in part on a plurality of normals of tessellated polygons and, for example, based at least in part on areas of the tessellated polygons.

As an example, a method may include generating one or more convex hulls by applying a Graham scan algorithm. As an example, a method may include splitting by implementing an angular splitting parameter. As an example, splitting may include generating areas in at least one plane intersected by a subterranean structure. As an example, splitting may generate line segments, for example, where each of the line segments includes end points.

As an example, a method may include splitting a curve where the curve is determined by intersection of a structure with a plane. As an example, a method may include repeating splitting for a plurality of positions of the plane along a coordinate direction.

As an example, splitting can include intersecting a subterranean structure by a plane to generate intersection points that form a curve and then splitting the curve into portions. In such an example, splitting may include representing each of the portions by a line segment where, for example, each of the line segments has an associated area.

As an example, a method may include generating a convex hull by providing a best fit plane. As an example, a method may include outputting a discrete fracture network as a model represented at least in part by a set of convex hulls.

As an example, a system can include a processor; memory operatively coupled to the processor; one or more modules stored in the memory and including processor executable instructions to instruct the system to: receive information that defines a three-dimensional subterranean structure; split the subterranean structure into portions; generate convex hulls for the portions; and generate a discrete fracture network based at least in part on the convex hulls.

As an example, such a system may include instructions to simulate phenomena associated with a subterranean formation based at least in part on a model that includes the discrete fracture network. As an example, instructions to generate a convex hull for at least one of the portions may include instructions to apply a Graham scan algorithm.

As an example, one or more computer-readable storage media can include processor-executable instructions to instruct a computer to: receive information that defines a three-dimensional subterranean structure; split the subterranean structure into portions; generate convex hulls for the portions; and generate a discrete fracture network based at least in part on the convex hulls.

As an example, one or more computer-readable storage media may include processor-executable instructions to instruct a computer to simulate phenomena associated with a subterranean formation based at least in part on a model that includes a discrete fracture network. As an example, one or more computer-readable storage media may include processor-executable instructions to instruct a computer to generate a convex hull for at least one portion of a split structure, for example, by applying a Graham scan algorithm.

Figure 20:
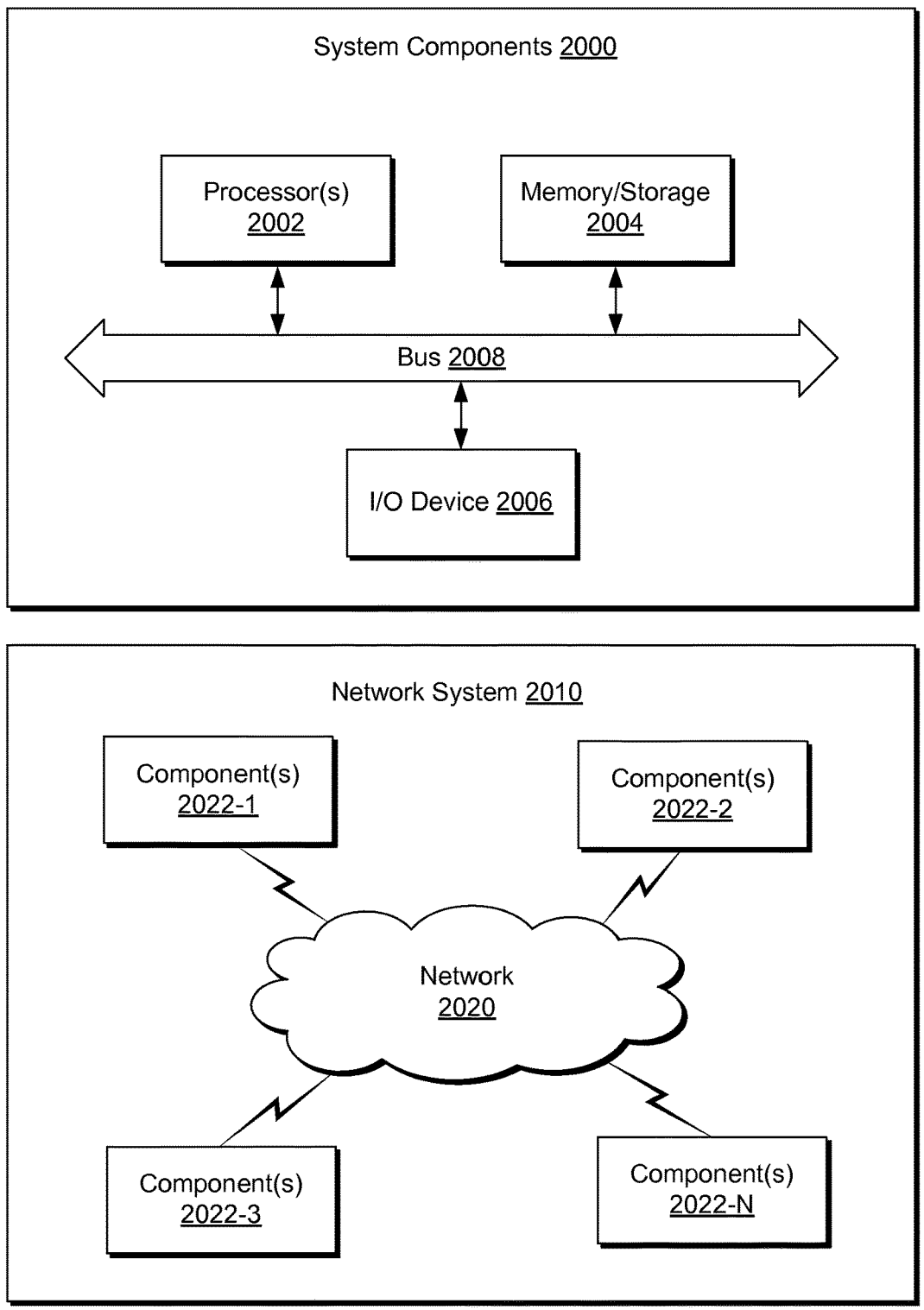
FIG. 20 illustrates example components of a system and a networked system.

FIG. 20 shows components of an example of a computing system 2000 and an example of a networked system 2010. The system 2000 includes one or more processors 2002, memory and/or storage components 2004, one or more input and/or output devices 2006 and a bus 2008. In an example embodiment, instructions may be stored in one or more computer-readable media (e.g., memory/storage components 2004). Such instructions may be read by one or more processors (e.g., the processor(s) 2002) via a communication bus (e.g., the bus 2008), which may be wired or wireless. The one or more processors may execute such instructions to implement (wholly or in part) one or more attributes (e.g., as part of a method). A user may view output from and interact with a process via an I/O device (e.g., the device 2006). In an example embodiment, a computer-readable medium may be a storage component such as a physical memory storage device, for example, a chip, a chip on a package, a memory card, etc. (e.g., a computer-readable storage medium).

In an example embodiment, components may be distributed, such as in the network system 2010. The network system 2010 includes components 2022-1, 2022-2, 2022-3, . . . 2022-N. For example, the components 2022-1 may include the processor(s) 2002 while the component(s) 2022-3 may include memory accessible by the processor(s) 2002. Further, the component(s) 2002-2 may include an I/O device for display and optionally interaction with a method. The network may be or include the Internet, an intranet, a cellular network, a satellite network, etc.

As an example, a device may be a mobile device that includes one or more network interfaces for communication of information. For example, a mobile device may include a wireless network interface (e.g., operable via IEEE 802.11, ETSI GSM, BLUETOOTH®, satellite, etc.). As an example, a mobile device may include components such as a main processor, memory, a display, display graphics circuitry (e.g., optionally including touch and gesture circuitry), a SIM slot, audio/video circuitry, motion processing circuitry (e.g., accelerometer, gyroscope), wireless LAN circuitry, smart card circuitry, transmitter circuitry, GPS circuitry, and a battery. As an example, a mobile device may be configured as a cell phone, a tablet, etc. As an example, a method may be implemented (e.g., wholly or in part) using a mobile device. As an example, a system may include one or more mobile devices.

As an example, a system may be a distributed environment, for example, a so-called "cloud" environment where various devices, components, etc. interact for purposes of data storage, communications, computing, etc. As an example, a device or a system may include one or more components for communication of information via one or more of the Internet (e.g., where communication occurs via one or more Internet protocols), a cellular network, a satellite network, etc. As an example, a method may be implemented in a distributed environment (e.g., wholly or in part as a cloud-based service).

As an example, information may be input from a display (e.g., consider a touchscreen), output to a display or both. As an example, information may be output to a projector, a laser device, a printer, etc. such that the information may be viewed. As an example, information may be output stereographically or holographically. As to a printer, consider a 2D or a 3D printer. As an example, a 3D printer may include one or more substances that can be output to construct a 3D object. For example, data may be provided to a 3D printer to construct a 3D representation of a subterranean formation. As an example, layers may be constructed in 3D (e.g., horizons, etc.), geobodies constructed in 3D, etc. As an example, holes, fractures, etc., may be constructed in 3D (e.g., as positive structures, as negative structures, etc.).

Although only a few example embodiments have been described in detail above, those skilled in the art will readily appreciate that many modifications are possible in the example embodiments. Accordingly, all such modifications are intended to be included within the scope of this disclosure as defined in the following claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112, paragraph 6 for any limitations of any of the claims herein, except for those in which the claim expressly uses the words "means for" together with an associated function.

What is claimed is:

1. A method comprising:
receiving information that defines a three-dimensional subterranean structure wherein the information is at least in part derived from seismic data of at least a portion of the three-dimensional subterranean structure acquired via sensors and wherein the three-dimensional subterranean structure comprises a curved surface;
automatically splitting the three-dimensional subterranean structure into portions wherein the splitting implements a top view, split angle criterion to generate a series of horizontal line segments that represent the curved surface from the top view, wherein each of the horizontal line segment comprises end points;

based at least in part on the end points, generating planar convex hulls for the portions;

generating a three-dimensional discrete fracture network based at least in part on the planar convex hulls; and based at least in part on the three-dimensional discrete fracture network, positioning one or more wells.

2. The method of claim 1 further comprising simulating phenomena associated with a subterranean formation based at least in part on a model that comprises the discrete fracture network.

3. The method of claim 1 wherein the generating planar convex hulls comprises applying a Graham scan algorithm.

4. The method of claim 1 wherein each of the line segments is associated with an area.

5. The method of claim 1 wherein the generating planar convex hulls comprises determining a best fit plane.

6. The method of claim 1 further comprising outputting that outputs the three-dimensional discrete fracture network as a model represented at least in part by a set of planar convex hulls.

7. The method of claim 1 further comprising tessellating at least a portion of the three-dimensional subterranean structure into polygons; computing a normal for each of the polygons; and determining one or more dip values based on the normals of the polygons.

8. A system comprising:
a processor;
memory operatively coupled to the processor;
processor executable instructions stored in the memory and executable to instruct the system to;
receive information that defines a three-dimensional subterranean structure wherein the information is at least in part derived from seismic data of at least a portion of the three-dimensional subterranean structure acquired via sensors and wherein the three-dimensional subterranean structure comprises a curved surface;
automatically split the three-dimensional subterranean structure into portions via implementation of a top view, split angle criterion to generate a series of horizontal line segments that represent the curved surface from the top view, wherein each of the horizontal line segments comprises end points;
based at least in part on the end points, generate planar convex hulls for the portions;
generate a three-dimensional discrete fracture network based at least in part on the planar convex hulls; and
based at least in part on the three-dimensional discrete fracture network, positioning one or more wells.

9. The system of claim 8 wherein the processor executable instructions to instruct the system comprise instructions to simulate phenomena associated with a subterranean formation based at least in part on a model that includes the discrete fracture network.

10. The system of claim 8 wherein the instructions to generate a planar convex hull for at least one of the portions comprises instructions to apply a Graham scan algorithm.

11. One or more non-transitory computer-readable storage media comprising processor-executable instructions to instruct a computer to:
receive information that defines a three-dimensional subterranean structure wherein the information is at least in part derived from seismic data of at least a portion of the three-dimensional subterranean structure acquired via sensors and wherein the three-dimensional subterranean structure comprises a curved surface;
automatically split the three-dimensional subterranean structure into portions via implementation of a top view, split angle criterion to generate a series of horizontal line segments that represent the curved surface from the top view, wherein each of the horizontal line segments comprises end points;
based at least in part on the end points, generate planar convex hulls for the portions;
generate a three-dimensional discrete fracture network based at least in part on the planar convex hulls; and
based at least in part on the three-dimensional discrete fracture network, positioning one or more wells.

12. The one or more non-transitory computer-readable storage media of claim 11 comprising processor-executable instructions to instruct the computer to simulate phenomena associated with a subterranean formation based at least in part on a model that includes the three-dimensional discrete fracture network.

13. The one or more non-transitory computer-readable storage media of claim 11 comprising processor-executable instructions to instruct the computer to generate a planar convex hull for at least one of the portions by applying a Graham scan algorithm.

* * * * *